United States Patent
Liang et al.

(10) Patent No.: US 10,684,640 B2
(45) Date of Patent: Jun. 16, 2020

(54) JOYSTICK DEVICE AND REMOTE CONTROL HAVING THE SAME

(71) Applicant: AUTEL ROBOTICS CO., LTD., Shenzhen, Guangdong (CN)

(72) Inventors: Zhiying Liang, Guangdong (CN); Huihua Zhang, Guangdong (CN)

(73) Assignee: AUTEL ROBOTICS CO., LTD., Shenzhen (CN)

( * ) Notice: Subject to any disclaimer, the term of this patent is extended or adjusted under 35 U.S.C. 154(b) by 0 days.

(21) Appl. No.: 16/173,549

(22) Filed: Oct. 29, 2018

(65) Prior Publication Data

US 2019/0113947 A1    Apr. 18, 2019

Related U.S. Application Data

(63) Continuation of application No. PCT/CN2018/083756, filed on Apr. 19, 2018.

(30) Foreign Application Priority Data

Aug. 25, 2017    (CN) .......................... 2017 1 0742687

(51) Int. Cl.
   *G05G 9/047*    (2006.01)
   *G05D 1/00*    (2006.01)
   (Continued)

(52) U.S. Cl.
   CPC .............. *G05G 9/047* (2013.01); *A63H 30/04* (2013.01); *G05D 1/0016* (2013.01); *G05D 1/101* (2013.01);
   (Continued)

(58) Field of Classification Search
   None
   See application file for complete search history.

(56) References Cited

U.S. PATENT DOCUMENTS 3,900,817 A * 8/1975 Punt ...................... H01C 10/04
                                                    338/157
4,500,867 A * 2/1985 Ishitobi .................. G01D 5/145
                                                    200/6 A
(Continued)

FOREIGN PATENT DOCUMENTS

CN    101034296 A    9/2007
CN    202306383 U    7/2012
(Continued)

OTHER PUBLICATIONS

International Search Report dated Jun. 27, 2018; PCT/CN2015/083756.

*Primary Examiner* — Xanthia C Cunningham

(57) ABSTRACT

A joystick device includes an operating rod assembly, a magnetic component mounted to the operating rod assembly, a circuit board and a reset assembly. The circuit board includes a magnetic sensor facing the magnetic component. The magnetic component is capable of moving from an initial position relative to the magnetic sensor along a first direction or a second direction opposite to the first direction when driven by the operating rod assembly. The reset assembly is connected to the operating rod assembly, configured to reset the operating rod assembly along the second direction or the first direction, so that the magnetic component is reset to the initial position. In the present application, the reset assembly is configured to reset the operating rod assembly along the second direction or the first direction, so that the magnetic component is reset to the initial position, thereby simplifying operations of the joystick device.

19 Claims, 19 Drawing Sheets

(51) Int. Cl.
  *G05D 1/10* (2006.01)
  *H05K 5/00* (2006.01)
  *G05G 5/05* (2006.01)
  *A63H 30/04* (2006.01)
  *G08C 17/02* (2006.01)
  *H05K 5/02* (2006.01)
  *B64C 13/04* (2006.01)
  *B64C 39/02* (2006.01)
  *H05K 1/18* (2006.01)
  *A63F 9/24* (2006.01)

(52) U.S. Cl.
  CPC ............... *G05G 5/05* (2013.01); *G08C 17/02* (2013.01); *H05K 5/0004* (2013.01); *A63F 2009/2407* (2013.01); *B64C 13/0421* (2018.01); *B64C 39/024* (2013.01); *B64C 2201/146* (2013.01); *G05G 2009/04755* (2013.01); *G05G 2505/00* (2013.01); *H05K 1/181* (2013.01); *H05K 5/0226* (2013.01); *H05K 2201/10151* (2013.01)

(56) References Cited

U.S. PATENT DOCUMENTS

| | | | | |
|---|---|---|---|---|
| 5,168,221 A * | 12/1992 | Houston | ................ | G01B 7/003 324/207.13 |
| 5,619,195 A * | 4/1997 | Allen | ..................... | G05G 9/047 200/6 R |
| 5,714,980 A * | 2/1998 | Niino | .................... | G05G 9/047 345/157 |
| 6,266,046 B1 * | 7/2001 | Arita | ...................... | G05G 9/047 345/156 |
| 6,501,458 B2 * | 12/2002 | Baker | ................... | E02F 9/2004 345/161 |
| 6,606,085 B1 * | 8/2003 | Endo | .................. | G05G 9/04796 345/159 |
| 6,637,311 B2 * | 10/2003 | Barden | ................. | E02F 9/2004 74/471 XY |
| 6,992,602 B2 * | 1/2006 | Alexander | ............. | G05G 9/047 318/560 |
| 8,482,523 B2 * | 7/2013 | Didier | ...................... | G05G 1/02 345/161 |
| 9,046,167 B2 * | 6/2015 | Farges | .................. | F16H 59/044 |
| 9,436,208 B2 * | 9/2016 | Kim | ......................... | F16H 59/04 |
| 2007/0262959 A1 * | 11/2007 | Gu | .......................... | G05G 9/047 345/161 |
| 2016/0306379 A1 * | 10/2016 | Zils | ........................ | G05G 5/02 |
| 2017/0001106 A1 * | 1/2017 | Gassoway | ............. | G06F 3/0338 |
| 2017/0083039 A1 | 3/2017 | Wuisan et al. | | |

FOREIGN PATENT DOCUMENTS

| | | |
|---|---|---|
| CN | 204215304 U | 3/2015 |
| CN | 204332792 U | 5/2015 |
| CN | 106297247 A | 1/2017 |
| CN | 106373360 A | 2/2017 |
| CN | 206235915 U | 6/2017 |
| DE | 102011085146 A1 | 4/2013 |
| DE | 102015017170 A1 | 3/2017 |

\* cited by examiner

JOYSTICK DEVICE AND REMOTE CONTROL HAVING THE SAME

This application is a continuation application of International Application No. PCT/CN2018/083756, filed on Apr. 19, 2018, which claims priority to Chinese Patent Application No. 201710742687.X, filed on Aug. 25, 2017, and entitled "JOYSTICK DEVICE AND REMOTE CONTROL HAVING THE SAME", which is incorporated herein by reference in its entirety.

BACKGROUND

Technical Field

The present application relates to the field of remote control technologies, and in particular, to a joystick device and a remote control having the same.

Related Art

Currently, more and more electronic products such as unmanned aerial vehicles (UAV), model airplanes and electric toys are operated by adopting remote control technologies, that is, by adopting remote controls.

A remote control is basically provided with a joystick device. However, there is no vivid correspondence between an operation of the joystick device and an actual movement of a remotely controlled mobile device and operations are complex, leading to poor user experience.

SUMMARY

To resolve the foregoing technical problem, embodiments of the present application provide a joystick device that is easy to operate and a remote control having the same.

To resolve the foregoing technical problem, the embodiments of the present application provide the following technical solutions:

A joystick device includes an operating rod assembly, a first magnetic component, a first circuit board and a first reset assembly. The first magnetic component is mounted to the operating rod assembly. The First circuit board includes a first magnetic sensor. The first magnetic sensor faces the first magnetic component. The first magnetic component is capable of moving from an initial position relative to the first magnetic sensor along a first direction or a second direction when driven by the operating rod assembly. The first direction is opposite to the second direction. The first reset assembly is connected to the operating rod assembly. The first reset assembly is configured to reset the operating rod assembly along the second direction or the first direction, so that the first magnetic component is reset to the initial position.

In some embodiments, the first magnetic component is capable of linearly moving from the initial position relative to the first magnetic sensor along the first direction or the second direction when driven by the operating rod assembly. The joystick device includes a second magnetic component, a second circuit board and a second reset assembly. The second magnetic component is mounted to the operating rod assembly. The second circuit board includes a second magnetic sensor. The second magnetic sensor faces the second magnetic component. The second magnetic component is capable of rotating from an initial position relative to the second magnetic sensor along a third rotation direction or a fourth rotation direction when driven by the operating rod assembly. The second reset assembly is connected to the operating rod assembly. The second reset assembly is configured to reset the operating rod assembly along the third rotation direction or the fourth rotation direction, so that the second magnetic component is reset to the initial position.

In some embodiments, the operating rod assembly includes a first rod body, a second rod body and a pin shaft. Central shafts of the first rod body and the second rod body are disposed along the first direction and the second direction. The first rod body is provided with an accommodating passage and a pin hole. The accommodating passage is provided along an axial direction of the first rod body. The pin hole is provided in an outer side wall of the first rod body. An outer side wall of the second rod body is provided with a sliding groove. The sliding groove is provided along an axial direction of the second rod body. The second rod body is partially accommodated in the accommodating passage and is capable of moving relative to the first rod body along the axial direction of the second rod body. One end of the pin shaft passes through the pin hole and is accommodated in the sliding groove.

In some embodiments, the second rod body is connected to the first reset assembly and the second reset assembly. The first magnetic component is mounted to the first rod body. The first rod body, the pin shaft and the first magnetic component are capable of linearly moving relative to the second rod body together along the first direction or the second direction. The first reset assembly is configured to drive the pin shaft to reset along the first direction or the second direction, so that the first magnetic component is reset to the initial position.

In some embodiments, the first reset assembly includes a mounting bracket, a swing block and an elastic component. The mounting bracket includes a first limiting post and is provided with a first guide groove. The number of the swing blocks is two, one end of each swing block and one end of the other swing block being both hingedly connected to the mounting bracket. Two ends of the elastic component are separately connected to the other end of each swing block. The second rod body is fixedly mounted to the mounting bracket. The pin shaft passes through the first guide groove and is capable of moving along the first direction or the second direction within the first guide groove. The pin shaft and the first limiting post are located between the two swing blocks.

In some embodiments, each swing block includes a hinged end, an abutment portion and a free end. The abutment portion is located between the hinged end and the free end. Two hinged ends of the two swing blocks are both hingedly connected to the mounting bracket. The two ends of the elastic component are separately connected to the two free ends of the two swing blocks. The pin shaft and the first limiting post are disposed in parallel between the two abutment portions of the two swing blocks.

In some embodiments, the first circuit board is fixedly mounted to the mounting bracket. The mounting bracket is provided with a rod passage. The first rod body and the second rod body are partially accommodated in the rod passage. The second rod body is connected to the second reset assembly and the second magnetic component. The second magnetic component is capable of rotating from the initial position relative to the second magnetic sensor along the third rotation direction or the fourth rotation direction when driven by the second rod body. The second reset assembly is configured to reset the second rod body along the fourth rotation direction or the third rotation direction, so that the second magnetic component is reset to the initial position.

In some embodiments, the second reset assembly includes a connecting bracket, a rotating member and a torsion spring. The connecting bracket includes a bottom portion, a second limiting post and an arc-shaped inner side wall. The arc-shaped inner side wall is connected to the bottom portion. One end of the second limiting post is connected to the bottom portion. The rotating member includes a bottom plate and an arc-shaped outer side wall. The arc-shaped outer side wall is connected to the bottom plate. The bottom plate is provided with an arc-shaped second guide groove. A notch is provided between two ends of the arc-shaped outer side wall. The second limiting post passes through the second guide groove. The torsion spring is partially accommodated in a space limited by the arc-shaped outer side wall. The torsion spring includes two torsion spring mounting arms. The two torsion spring mounting arms pass through the notch and separately abut the two ends of the arc-shaped outer side wall. The second rod body passes through the connecting bracket and the rotating member. The second rod body is capable of driving the rotating member to rotate relative to the connecting bracket along the third rotation direction or the fourth rotation direction.

In some embodiments, the second rod body includes a connection end, the connection end being fixedly connected to the second magnetic component.

In some embodiments, the second reset assembly includes a fixing member, the second magnetic component being mounted to the fixing member, and the connection end being fixedly connected to the fixing member.

In some embodiments, the second circuit board is fixedly mounted to the connecting bracket.

In some embodiments, the first magnetic sensor and the second magnetic sensor are both Hall elements.

In some embodiments, the first magnetic component is capable of linearly moving from the initial position relative to the first magnetic sensor along the first direction or the second direction when driven by the operating rod assembly. The joystick device includes a second circuit board and a second reset assembly. The second circuit board is provided with a potentiometer. The operating rod assembly is inserted into the potentiometer and in contact with the potentiometer. The operating rod assembly is capable of rotating from an initial position relative to the potentiometer along a third rotation direction or a fourth rotation direction. The second reset assembly is connected to the operating rod assembly. The second reset assembly is configured to reset the operating rod assembly to the initial position along the fourth rotation direction or the third rotation direction.

In some embodiments, the joystick device includes a housing. The housing includes an upper housing and a bottom housing. The upper housing is mounted to the bottom housing. The bottom housing has a cavity. The operating rod assembly passes through the housing. The operating rod assembly is partially accommodated in the cavity. The first reset assembly, the first magnetic component and the first circuit board, the second reset assembly, the second magnetic component, and the second circuit board all are accommodated in the cavity.

In some embodiments, the second circuit board is fixedly mounted to the bottom housing.

In some embodiments, two engagement blocks separately extend from two opposite sides of the upper housing. An outer side of each engagement block is provided with a groove. The two grooves of the two engagement blocks are disposed in opposite directions. An inner wall of the cavity is provided with two oppositely disposed slots. An inner wall of each slot is provided with a protrusion. The upper housing covers an opening of the cavity. The engagement block is correspondingly inserted into the slot. The groove correspondingly accommodates the protrusion.

To resolve the foregoing technical problem, the embodiments of the present application further provide the following technical solution:

A remote control includes a housing and the joystick device described above and mounted in the housing.

Compared with the prior art, in the joystick device of the embodiments of the present application, the first reset assembly is configured to reset the operating rod assembly along the second direction or the first direction, so that the first magnetic component is reset to the initial position, thereby simplifying operations of the joystick device.

Moreover, the joystick device has movements in only four directions: linearly moving along the first direction and the second direction and rotating along the third rotation direction and the fourth rotation direction. The operations are simple and are easy to remember by a user.

BRIEF DESCRIPTION OF THE DRAWINGS

One or more embodiments are exemplarily described by using figures corresponding thereto in the accompanying drawings. The exemplary descriptions do not constitute a limitation on the embodiments. Elements with same reference signs in the accompanying drawings are similar elements. Unless otherwise particularly stated, the figures in the accompanying drawings constitute no scale limitation.

DETAILED DESCRIPTION

To help to understand the present application, the following describes in more detail the present application with reference to the accompanying drawings and specific implementations. It should be noted that when an element is described as being "fixed" to another element, it can be directly on the another element, or one or more intermediate elements may exist therebetween. When an element is described as being "electrically connected" to another element, it can be directly connected to the another element, or one or more intermediate elements may exist therebetween. Orientations or position relationships indicated by terms such as "above", "below", "front", "back", "top", "bottom", "inside" and "outside" that are used in this specification are orientations or position relationships indicated based on the accompanying drawings, and are used only for ease of describing the present application and of simplified descriptions rather than for indicating or implying that an apparatus or a component needs to have a particular orientation or needs to be constructed or operated in a particular orientation, and therefore, cannot be construed as a limitation to the present application. In addition, terms such as "first", "second" and "third" are used for descriptive purposes only and are not to be construed as indicating or implying relative importance.

Unless otherwise defined, meanings of all technical and scientific terms used in this specification are the same as those usually understood by a person skilled in the technical field of the present application. The terms used in the specification of the present application are merely intended to describe the specific implementations rather than limit the present application. A term "and/or" used in this specification includes any or all combinations of one or more of the related listed items.

In addition, the technical features involved in the different embodiments of the present application described below may be combined with each other as long as they do not constitute a conflict with each other.

Figure 1:
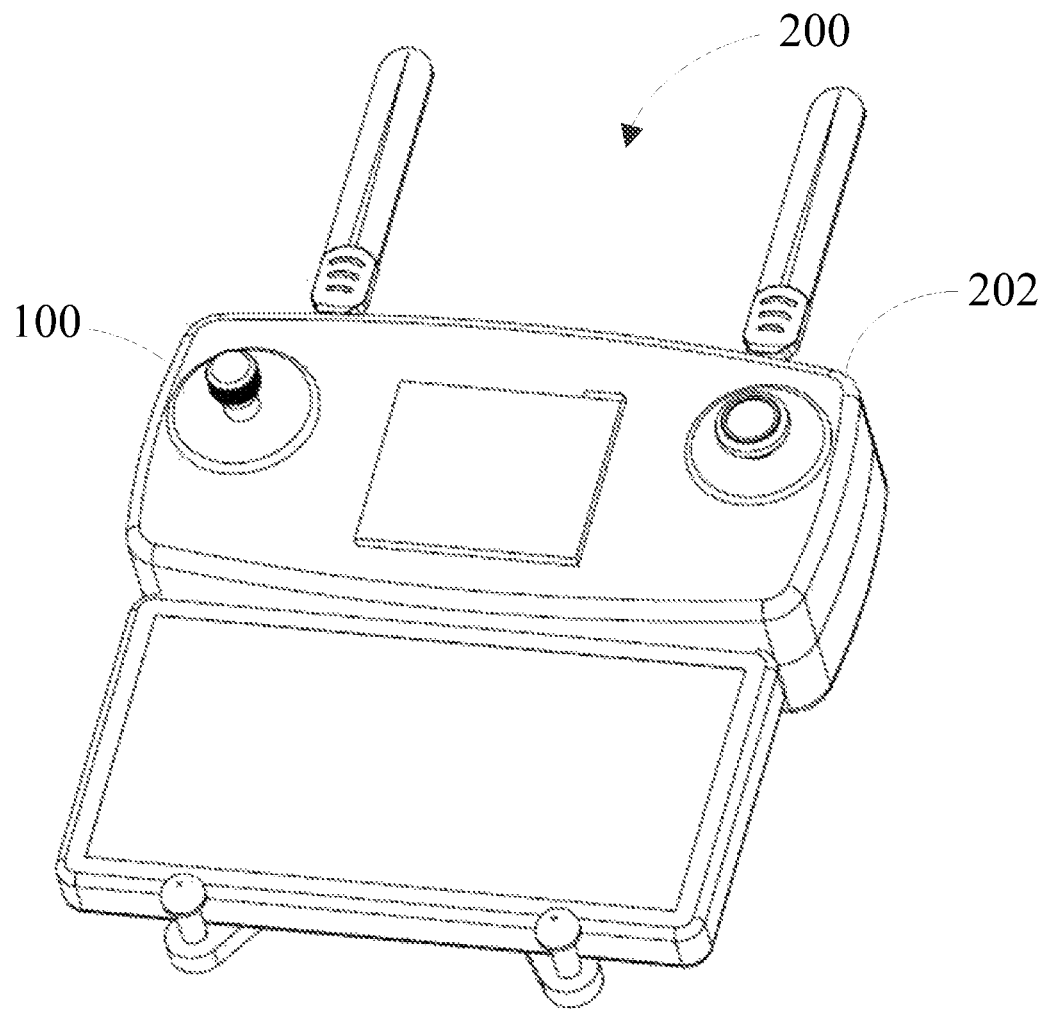
FIG. 1 is a simplified three dimensional view of a remote control according to an embodiment of the present application.

Referring to FIG. 1, a joystick device 100 provided in an embodiment of the present application is mounted to a remote control 200. The remote control 200 may be configured to remotely control a movable object. The movable object may be a UAV, a model airplane, an electric toy or the like. The remote control 200 includes a housing 202. The joystick device 100 is mounted in the housing 202.

Figure 2:
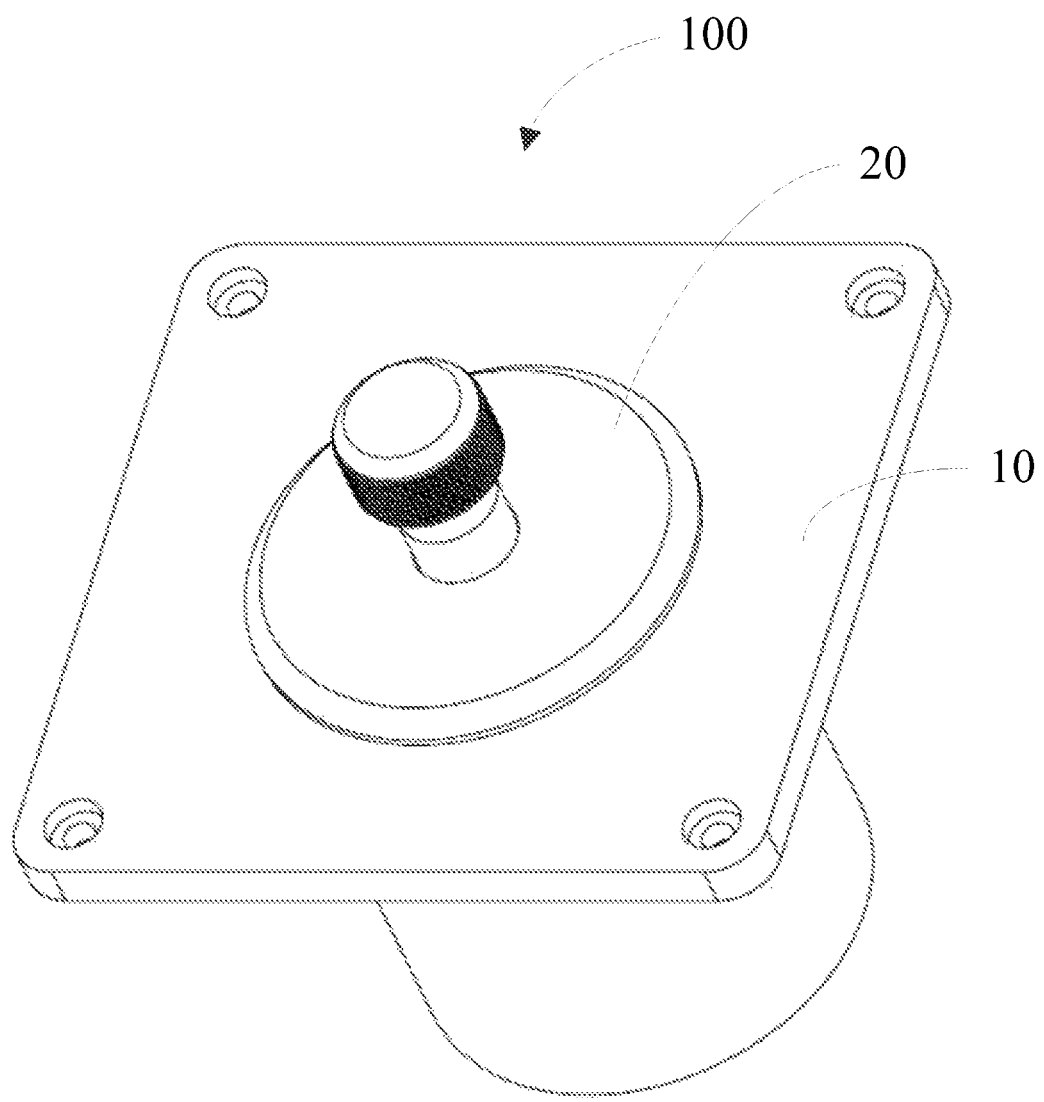
FIG. 2 is a simplified three dimensional view of a joystick device according to an embodiment of the present application.
Figure 3:
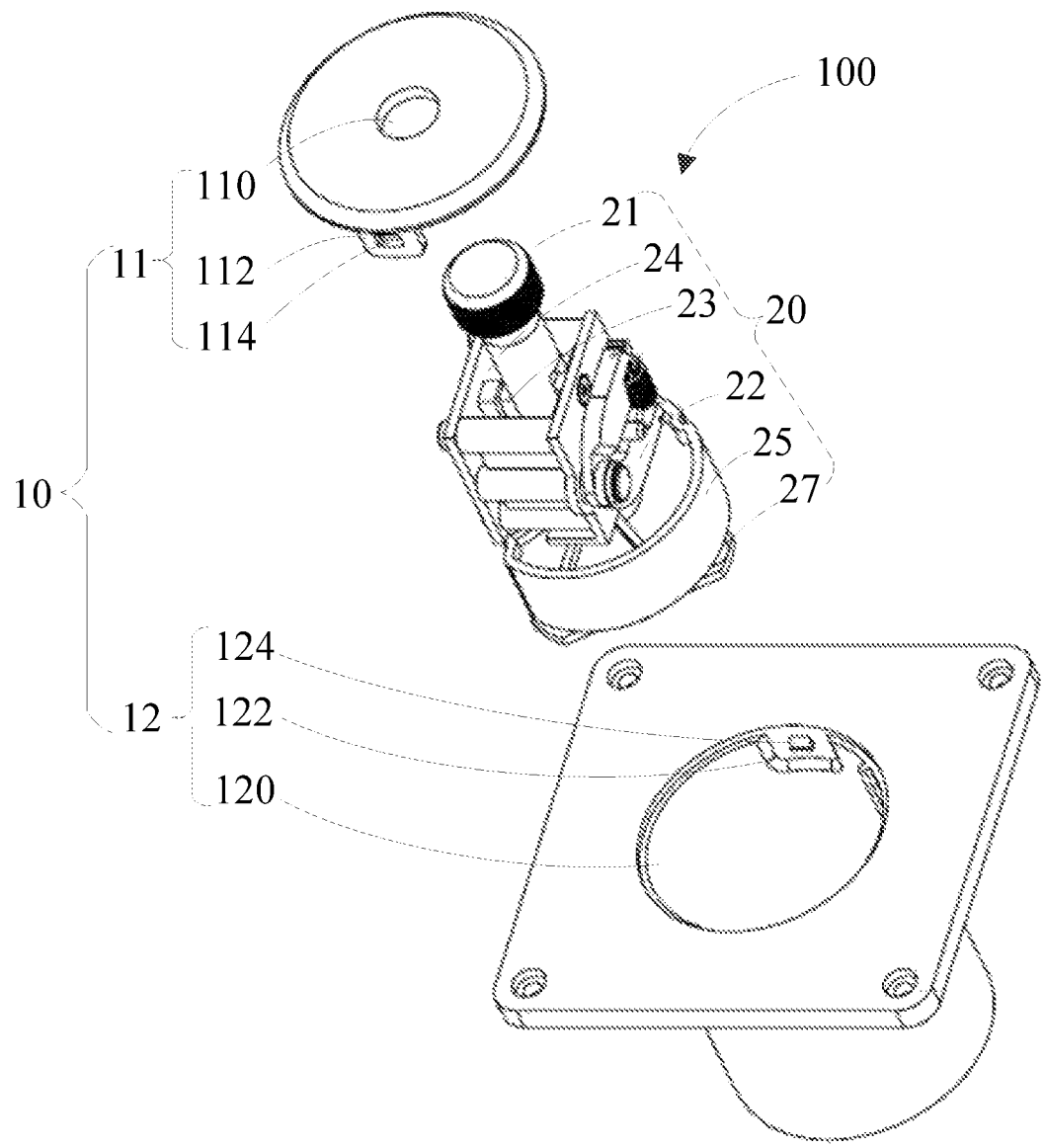
FIG. 3 is an exploded view of the joystick device shown in FIG. 2.

Referring to FIG. 2 and FIG. 3, the joystick device 100 includes a housing 10 and a joystick mechanism 20 mounted to the housing 10.

The housing 10 includes an upper housing 11 and a bottom housing 12. The upper housing 11 is substantially in a shape of a thin plate. A middle portion of the upper housing 11 is provided with a rod through hole 110. Two engagement blocks 112 separately and perpendicularly extend from two opposite sides of the upper housing 11. An outer side of each engagement block 112 is provided with a groove 114. The two grooves 114 of the two engagement blocks 112 are disposed in opposite directions.

The bottom housing 12 is provided with a cylindrical cavity 120. An inner wall of the cavity 120 is provided with two oppositely disposed slots 122. An inner wall of each slot 122 is provided with a protrusion 124. The upper housing 11 covers an opening of the cavity 120. The engagement block 112 is correspondingly inserted into the slot 122. The groove 114 correspondingly accommodates the protrusion 124. In this way, it is easy for the upper housing 11 to be quickly and accurately mounted to the bottom housing 12.

Figure 4:
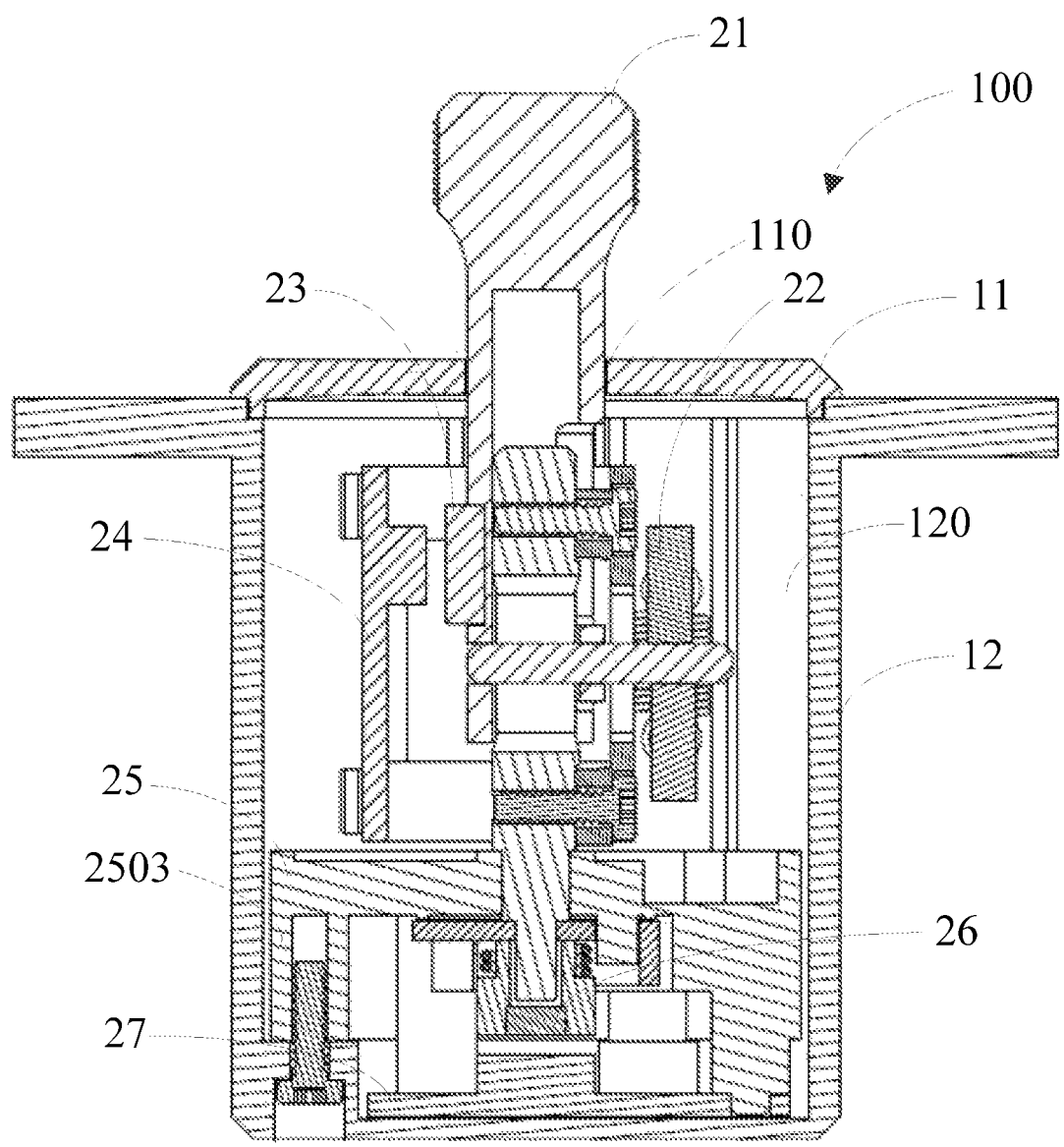
FIG. 4 is a sectional view of the joystick device shown in FIG. 2.
Figure 5:
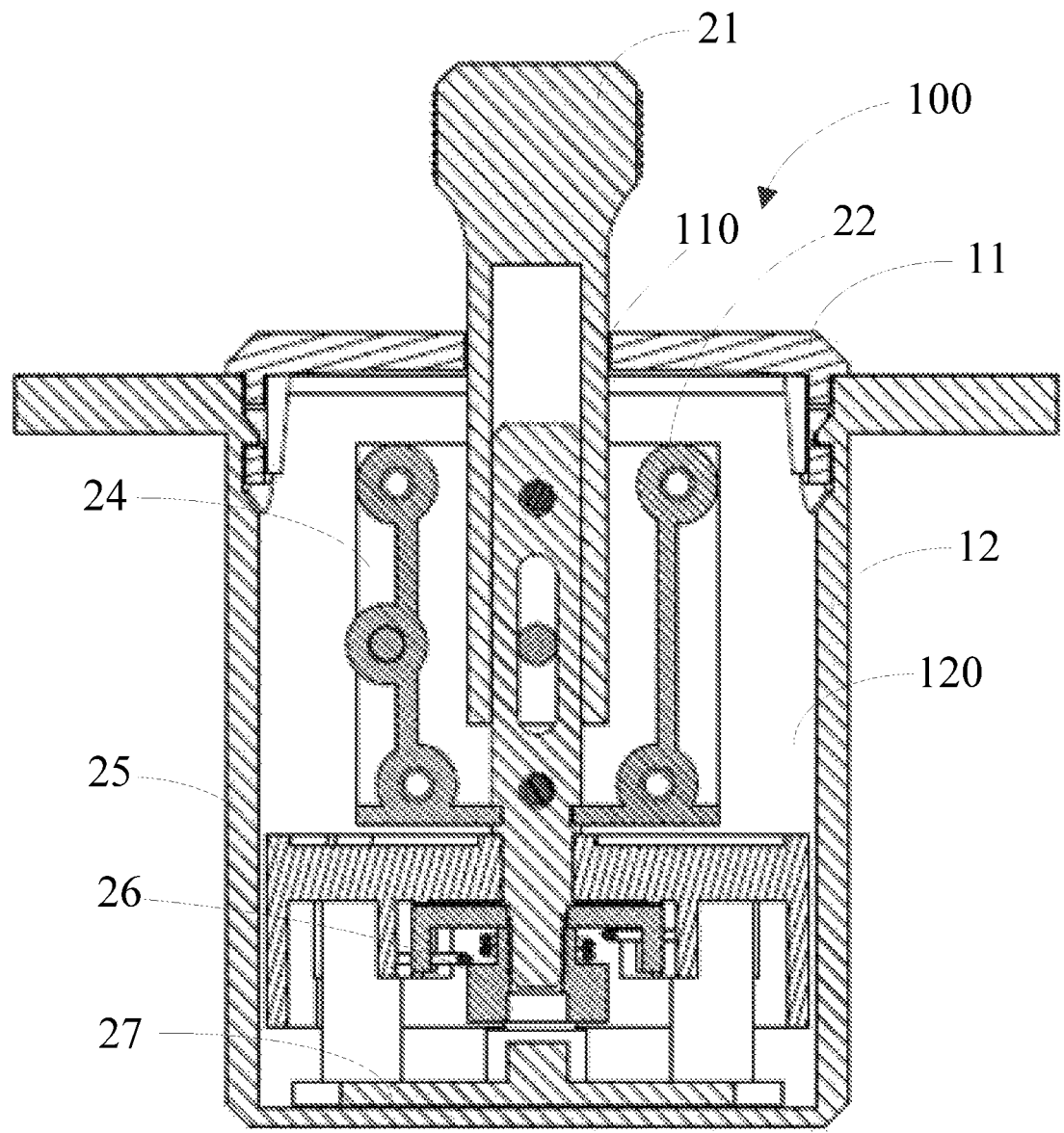
FIG. 5 is another sectional view of the joystick device shown in FIG. 2.

Further referring to FIG. 4 and FIG. 5, the joystick mechanism 20 includes an operating rod assembly 21, a first reset assembly 22, a first magnetic component 23, a first circuit board 24, a second reset assembly 25, a second magnetic component 26 and a second circuit board 27. One part of the operating rod assembly 21 passes through the rod through hole 110 and is exposed outside the housing 10. The remaining part of the operating rod assembly 21 is accommodated in the cavity 120. The first reset assembly 22, the first magnetic component 23, the first circuit board 24, the second reset assembly 25, the second magnetic component 26 and the second circuit board 27 are all accommodated in the cavity 120.

The first magnetic component 23 is mounted to the operating rod assembly 21. The first magnetic component 23 is capable of linearly moving from an initial position relative to the first circuit board 24 along a first direction or a second direction when driven by the operating rod assembly 21. The first direction is opposite to the second direction. The first reset assembly 22 is configured to reset the operating rod assembly 21 along the second direction or the first direction, so that the first magnetic component 23 is reset to the initial position. The second magnetic component 26 is mounted to the operating rod assembly 21. The second magnetic component 26 is capable of rotating from an initial position relative to the second circuit board 27 along a third rotation direction or a fourth rotation direction when driven by the operating rod assembly 21. The second reset assembly 25 is configured to reset the operating rod assembly 21 along the fourth rotation direction or the third rotation direction, so that the second magnetic component 26 is reset to the initial position. The third rotation direction is opposite to the fourth rotation direction.

Figure 6:
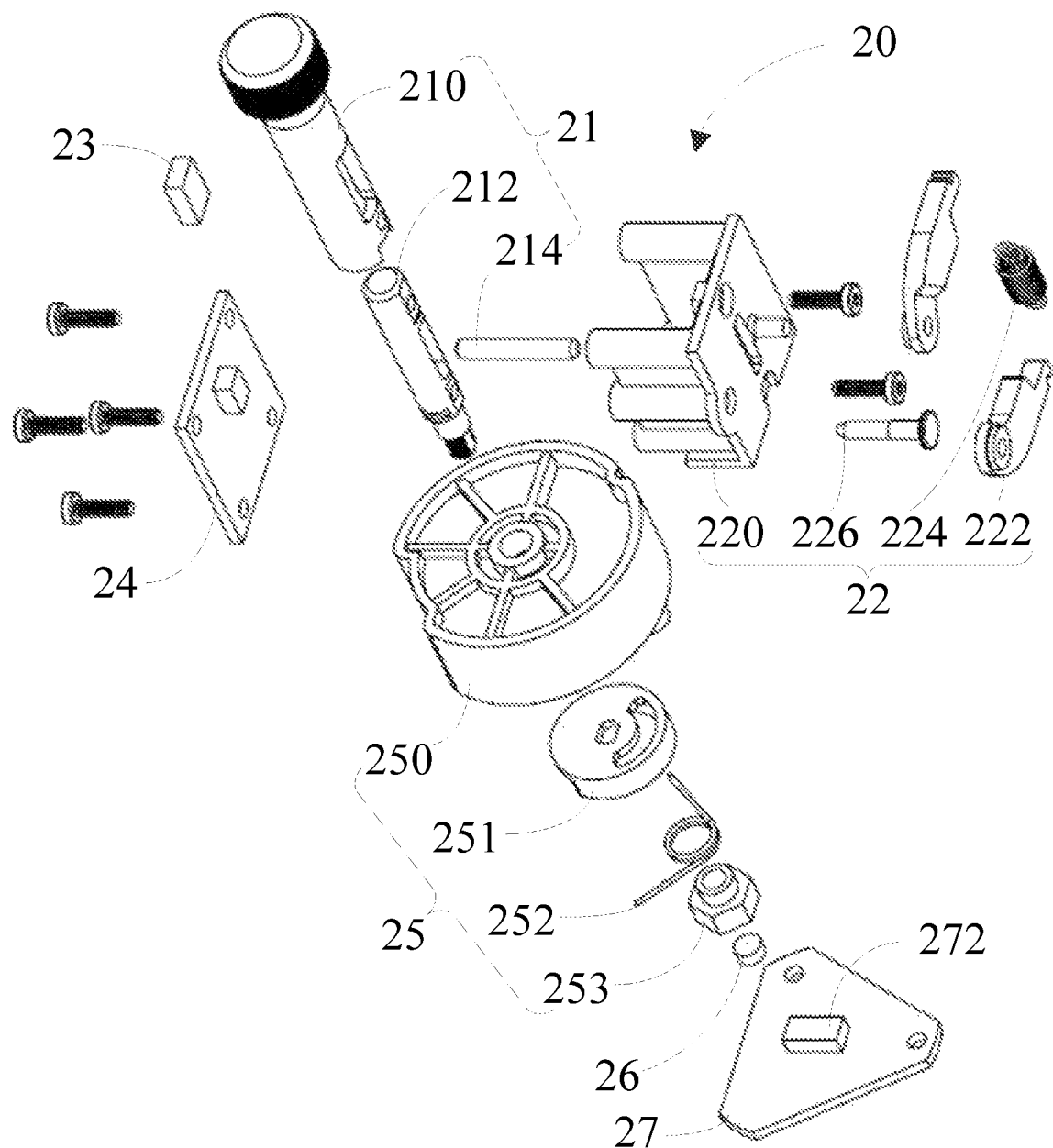
FIG. 6 is an exploded view of a joystick mechanism of the joystick device shown in FIG. 2.
Figure 7:
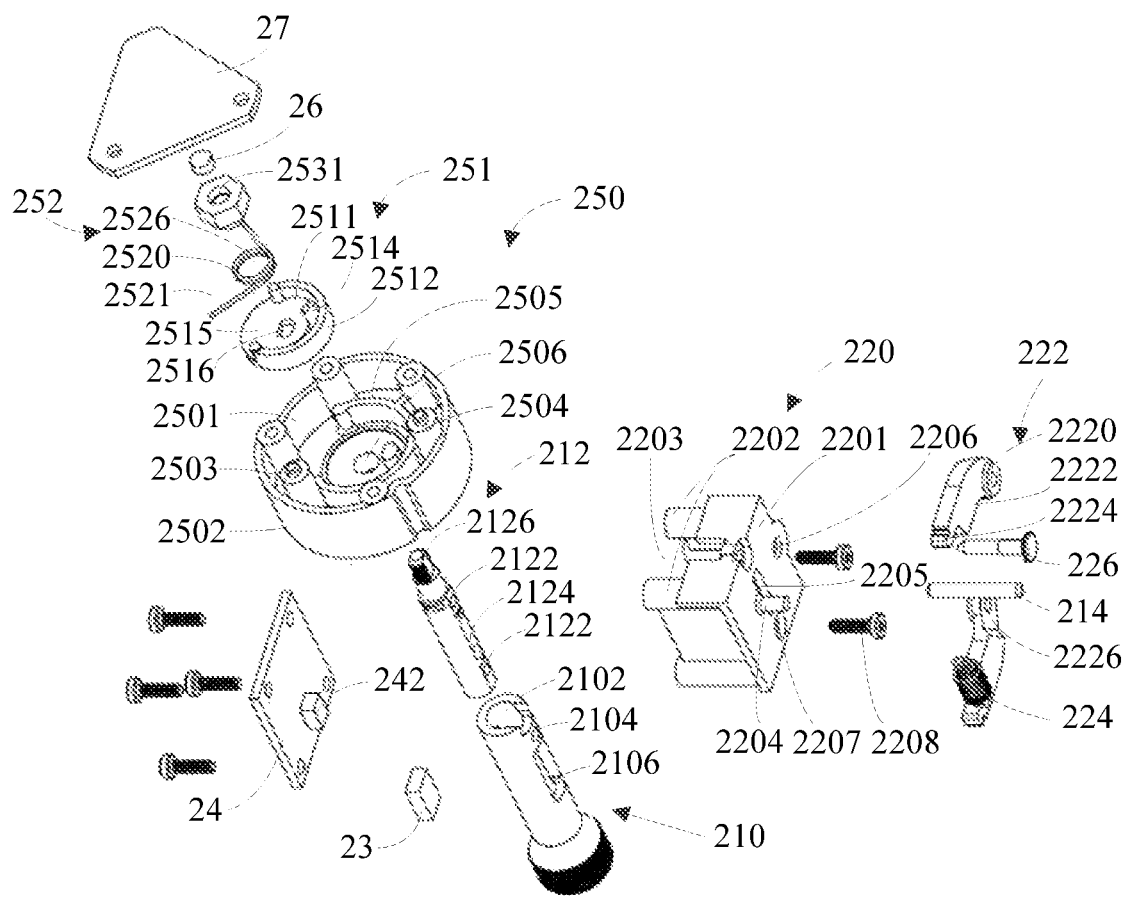
FIG. 7 is an exploded view of the joystick mechanism shown in FIG. 6 from another perspective.

Referring to FIG. 6 and FIG. 7, the operating rod assembly 21 includes a first rod body 210, a second rod body 212 and a pin shaft 214.

The first rod body 210 is a hollow cylinder, provided with an accommodating passage 2102, a pin hole 2104 and an opening slot 2106. The accommodating passage 2102 is provided along an axial direction of the first rod body 210. One end of the first rod body 210 is provided with an opening. The opening slot 2106 and the pin hole 2104 are provided in an outer side wall of the first rod body 210. The opening slot 2106 and the pin hole 2104 are both in communication with the accommodating passage 2102.

The second rod body 212 is a cylinder. An outer side wall of the second rod body 212 is provided with two threaded holes 2122 and a sliding groove 2124. The sliding groove 2124 is in an elongated shape and provided along an axial direction of the second rod body 212. The two threaded holes 2122 are provided on two sides of the sliding groove 2124. The second rod body 212 includes a connection end 2126. An outer side wall of the connection end 2126 is provided with an internal thread. In addition, the connection end 2126 has an elliptical cross section, for limiting rotation. The second rod body 212 is partially accommodated in the accommodating passage 2102 and is capable of moving relative to the first rod body 210 along the axial direction of the second rod body 212.

One end of the pin shaft 214 passes through the pin hole 2104, is accommodated in the sliding groove 2124, and is capable of sliding within the sliding groove 2124.

The first magnetic component 23 is mounted to the first rod body 210. The first rod body 210, the pin shaft 214 and the first magnetic component 23 are capable of linearly moving relative to the second rod body 212 together along the first direction or the second direction. In this embodiment, central shafts of the first rod body 210 and the second rod body 212 are both disposed along the first direction and the second direction.

The first reset assembly 22 includes a mounting bracket 220, a swing block 222, an elastic component 224 and a fixing shaft 226.

The mounting bracket 220 is substantially rectangular. The mounting bracket 220 includes a mounting plate 2201 and supporting blocks 2202. The two supporting blocks 2202 perpendicularly extend from two opposite sides of the mounting plate 2201. A rod passage 2203 is provided between the two supporting blocks 2202. The first rod body 210 and the second rod body 212 are partially accommodated in the rod passage 2203. The first circuit board 24 is mounted to the two supporting blocks 2202 by using multiple bolts. The first circuit board 24, the two supporting blocks 2202 and the mounting plate 2201 enclose the first rod body 210 and the second rod body 212.

The mounting plate 2201 includes a first limiting post 2204. One end of the first limiting post 2204 is perpendicularly connected to a surface of the mounting plate 2201 opposite to the supporting block 2202. The mounting plate 2201 is provided with a first guide groove 2205, a first mounting hole 2206 and second mounting holes 2207. The first guide groove 2205 is in an elongated shape and provided along the axial direction of the first rod body 210. The first mounting hole 2206 and the first limiting post 2204 are provided on two opposite sides of the first guide groove 2205. The two second mounting holes 2207 are provided on the other opposite sides of the first guide groove 2205. After passing through the two second mounting holes 2207, two bolts 2208 are inserted into the two threaded holes 2122 of the second rod body 212 to fix the second rod body 212 to the mounting plate 2201.

There are two swing blocks 222. Each swing block 222 includes a hinged end 2220, an abutment portion 2222 and a free end 2224. The abutment portion 2222 is located between the hinged end 2220 and the free end 2224. The hinged end 2220 is provided with a hinge hole 2226. After passing through the two hinge holes 2226 of the two swing blocks 222, the fixing shaft 226 is inserted into the first mounting hole 2206 to hingedly connect the two swing blocks 222 to the mounting plate 2201.

One end of the elastic component 224 is connected to a free end 2224 of one swing block 222. The other end of the elastic component 224 is connected to a free end 2224 of the other swing block 222.

The pin shaft 214 passes through the first guide groove 2205. In addition, the pin shaft 214 and the first limiting post 2204 are sandwiched in parallel between the two abutment portions 2222 of the two swing blocks 222.

In this embodiment, the elastic component 224 is a tension spring. It may be understood that in some other embodiments, the elastic component 224 may be another elastic component capable of providing an elastic force, such as a rubber band.

The first circuit board 24 includes a first magnetic sensor 242. The first magnetic sensor 242 faces the first magnetic component 23. The first magnetic sensor 242 is configured to sense a magnetic field change of the first magnetic component 23, to obtain a movement position of the first magnetic component 23. The first circuit board 24 generates a corresponding operation instruction according to the movement position of the first magnetic component 23 that is obtained by the first magnetic sensor 242. In this embodiment, the first magnetic sensor 242 is a Hall element. It may be understood that in some other embodiments, the first magnetic sensor 242 may be another magnetic sensor capable of sensing a magnetic field change, such as a magnetic coder.

The second reset assembly 25 includes a connecting bracket 250, a rotating member 251, a torsion spring 252 and a fixing member 253.

The connecting bracket 250 is a hollow cylinder. The connecting bracket 250 includes a circular bottom portion 2501, a ring-shaped outer side wall 2502, a mounting post 2503, a second limiting post 2504 and an arc-shaped inner side wall 2505. The ring-shaped outer side wall 2502 is perpendicularly connected to an outer edge of the circular bottom portion 2501. Similarly, the arc-shaped inner side wall 2505 is perpendicularly connected to the circular bottom portion 2501. One end of the second limiting post 2504 and one end of the mounting post 2503 are perpendicularly connected to the circular bottom portion 2501. A middle portion of the circular bottom portion 2501 is provided with a circular first shaft through hole 2506. The ring-shaped outer side wall 2502 and the arc-shaped inner side wall 2505 enclose the first shaft through hole 2506 and use the first shaft through hole 2506 as a center. The second limiting post 2504 is located between the first shaft through hole 2506 and the arc-shaped inner side wall 2505. The arc-shaped inner side wall 2505 is located between the second limiting post 2504 and the ring-shaped outer side wall 2502. The mounting post 2503 is in contact with an inner surface of the ring-shaped side wall 2502.

The rotating member 251 includes a circular bottom plate 2511 and an arc-shaped outer side wall 2512. The arc-shaped outer side wall 2512 is perpendicularly connected to an outer edge of the circular bottom plate 2511. The circular bottom plate 2511 is provided with an arc-shaped second guide groove 2514 and a second shaft through hole 2516. A cross section of the second shaft through hole 2516 is substantially elliptical and provided in a middle portion of the circular bottom plate 2511. The second guide groove 2514 is located between the second shaft through hole 2516 and the arc-shaped outer side wall 2512. A notch 2515 is formed between two ends of the arc-shaped outer side wall 2512.

The rotating member 251 is accommodated in a space limited by the arc-shaped inner side wall 2505. The second limiting post 2504 passes through the second guide groove 2514. The first shaft through hole 2506 is aligned with the second shaft through hole 2516.

The connecting bracket 250 and the rotating member 251 are injection molded from a plastic material.

The torsion spring 252 includes a torsion spring body 2520 and two torsion spring mounting arms 2521. The torsion spring body 2520 has a third shaft through hole 2526. The two torsion spring mounting arms 2521 are separately connected to the torsion spring body 2520. The torsion spring body 2520 is accommodated in a space limited by the arc-shaped outer side wall 2512. The third shaft through hole 2526 is aligned with the second shaft through hole 2516. The two torsion spring mounting arms 2521 are exposed from the notch 2515 and separately abut two ends of the arc-shaped outer side wall 2512.

The fixing member 253 is provided with an accommodating hole 2531. The second magnetic component 26 is accommodated in the accommodating hole 2531 and faces the second circuit board 27. The fixing member 253 is partially accommodated in the third shaft through hole 2526. In this embodiment, the fixing member 253 is a fixing nut.

The connection end 2126 of the second rod body 212 passes through the first shaft through hole 2506 and the second shaft through hole 2516 sequentially and is finally fixedly connected to the fixing member 253. A cross section of the connection end 2126 is substantially elliptical. A cross section of the second shaft through hole 2513 is substantially elliptical. In this way, the connection end 2126 rotates to drive the rotating member 251 and the fixing member 253 to both rotate relative to the connecting bracket 250. It may be understood that in some other embodiments, the cross section of the connection end 2126 and the cross section of the second shaft through hole 2513 may be in another rotation limiting structure. For example, the cross section of connection end 2126 and the cross section of the second shaft through hole 2513 may be D-shaped.

The second circuit board 27 includes a second magnetic sensor 272. The second magnetic sensor 272 faces the second magnetic component 26. The second magnetic sensor 272 is configured to sense a magnetic field change of the second magnetic component 26, to obtain a movement position of the second magnetic component 26. The second circuit board 27 generates a corresponding operation instruction according to the movement position of the second magnetic component 26 that is obtained by the second magnetic sensor 272. The second circuit board 27 is fixedly mounted to the connecting bracket 250. In this embodiment, the second magnetic sensor 272 is a Hall element. It may be understood that in some other embodiments, the second magnetic sensor 272 may be another magnetic sensor capable of sensing a magnetic field change, such as a magnetic coder.

Figure 8:
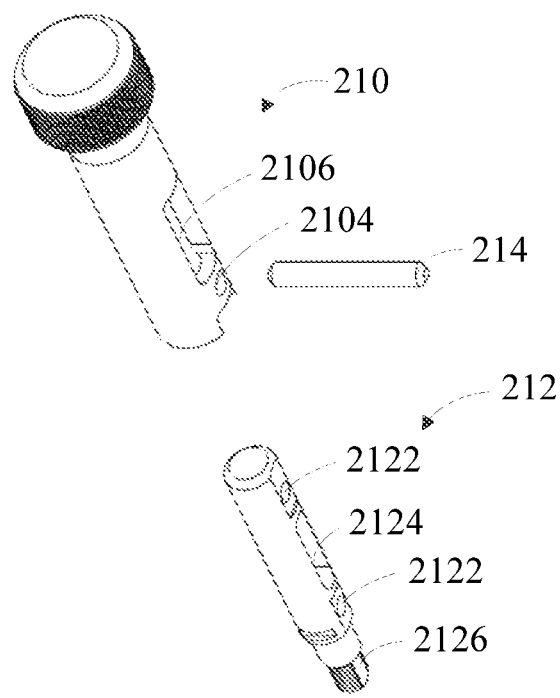
FIG. 8 is an exploded view of an operating rod assembly of the joystick mechanism shown in FIG. 6.
Figure 9:
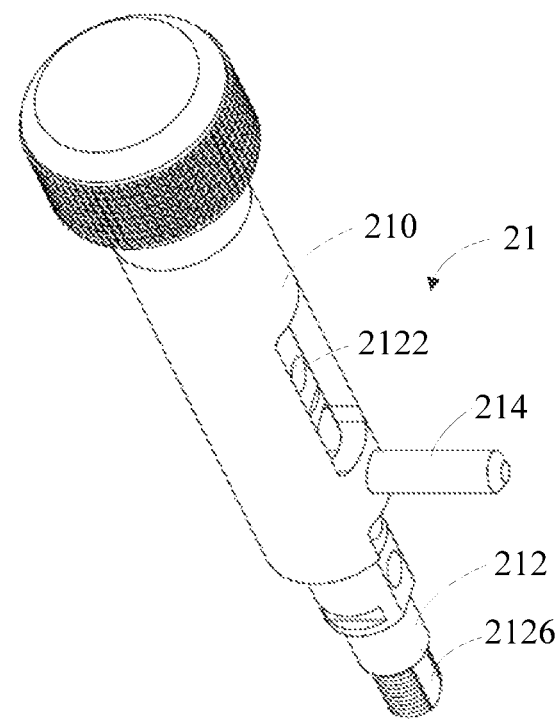
FIG. 9 is a three dimensional view of the operating rod assembly shown in FIG. 8.
Figure 10:
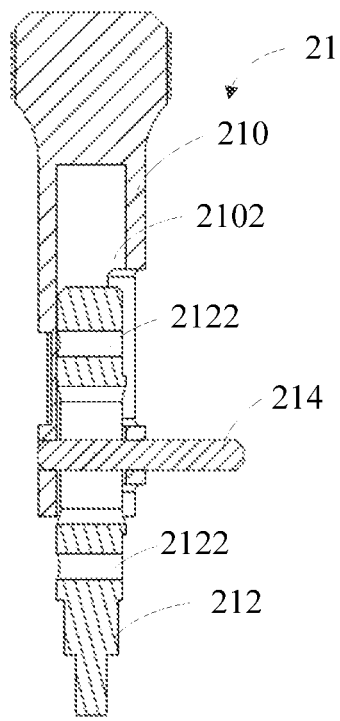
FIG. 10 is a sectional view of the operating rod assembly shown in FIG. 8.

During assembly, refer to FIG. 8 to FIG. 10. The second rod body 212 is inserted into the accommodating passage 2102 of the first rod body 210. After passing through the pin hole 2104, one end of the pin shaft 214 is inserted into the sliding groove 2124 of the second rod body 212. The operating rod assembly 21 is obtained through the assembly. One of the two threaded holes 2122 is exposed from the opening slot 2106. The connection end 2126 is exposed outside the accommodating passage 2102. One end of the pin shaft 214 moves inside the sliding groove 2124 when the first rod body 210 and the pin shaft 214 linearly move along the first direction or the second direction together.

Figure 11:
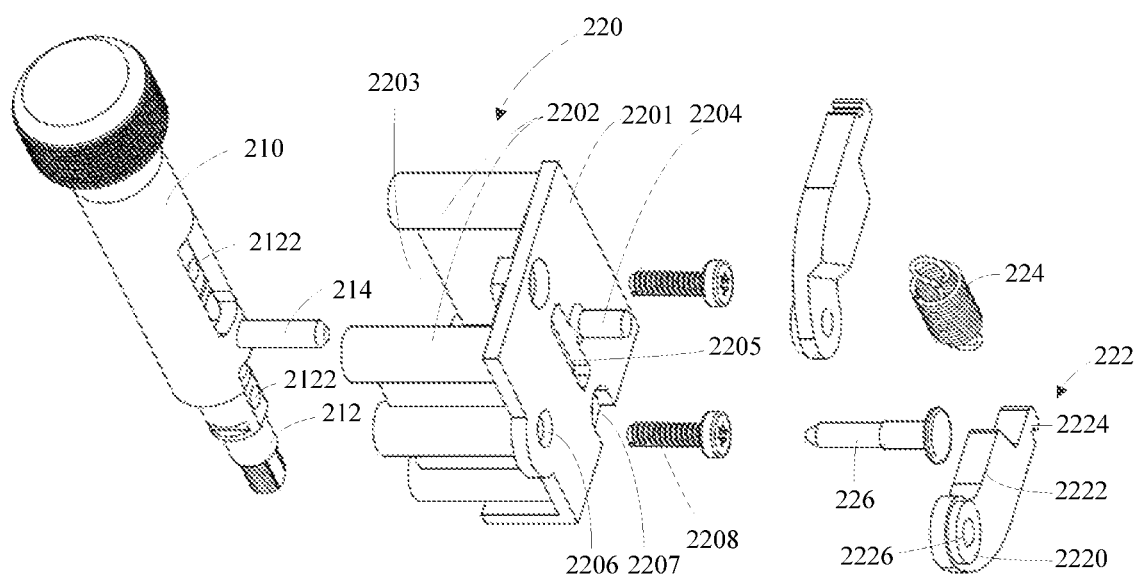
FIG. 11 is a schematic assembly diagram of the operating rod assembly of the joystick mechanism shown in FIG. 6 and a first reset assembly.
Figure 12:
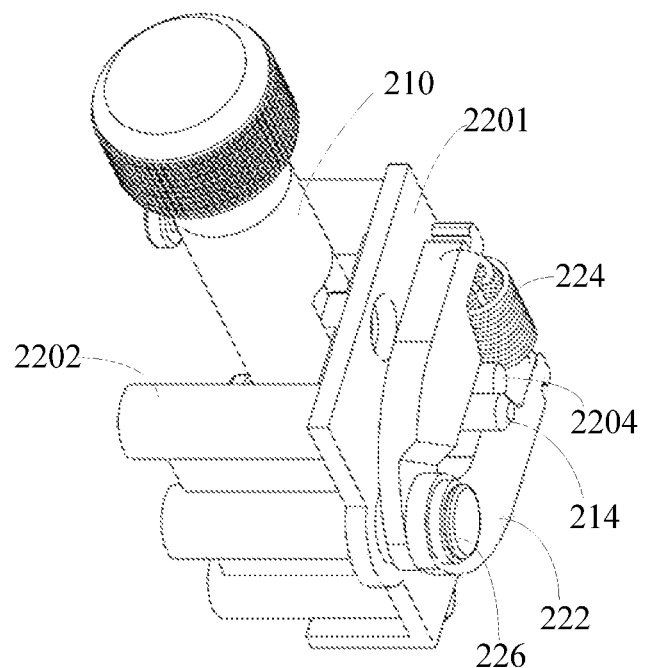
FIG. 12 is a three dimensional view of the operating rod assembly and the first reset assembly shown in FIG. 11.
Figure 13:
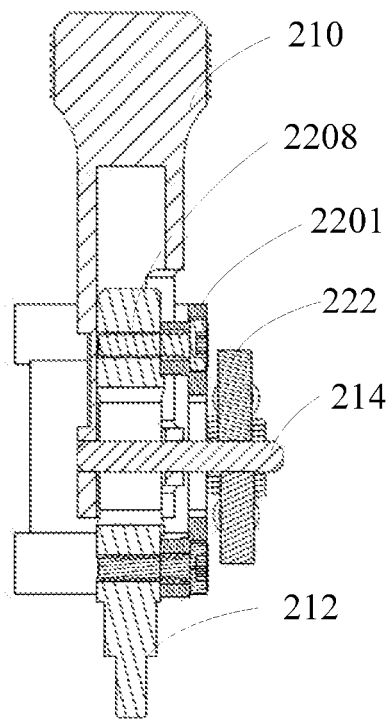
FIG. 13 is a sectional view of the operating rod assembly and the first reset assembly shown in FIG. 12.

Referring to FIG. 11 to FIG. 13, the pin shaft 214 passes through the first guide groove 2205. The first rod body 210 and the second rod body 212 are accommodated in the rod passage 2203. After passing through the second mounting hole 2207, the bolt 2208 is inserted into and fixed to the threaded hole 2122, so that the second rod body 212 is fixed to the mounting plate 2201. The hinge holes 2226 of the two swing blocks 222 are aligned with the first mounting hole 2206. After passing through the hinge hole 2226, the fixing shaft 226 is inserted into and fixed to the first mounting hole 2206, so that the swing block 222 is hingedly connected to the mounting plate 2201. The pin shaft 214 and the first limiting post 2204 are sandwiched in parallel between the two abutment portions 2222 of the two swing blocks 222. The two ends of the elastic component 224 are separately connected to the two free ends 2224 of the two swing blocks 222.

Figure 14:
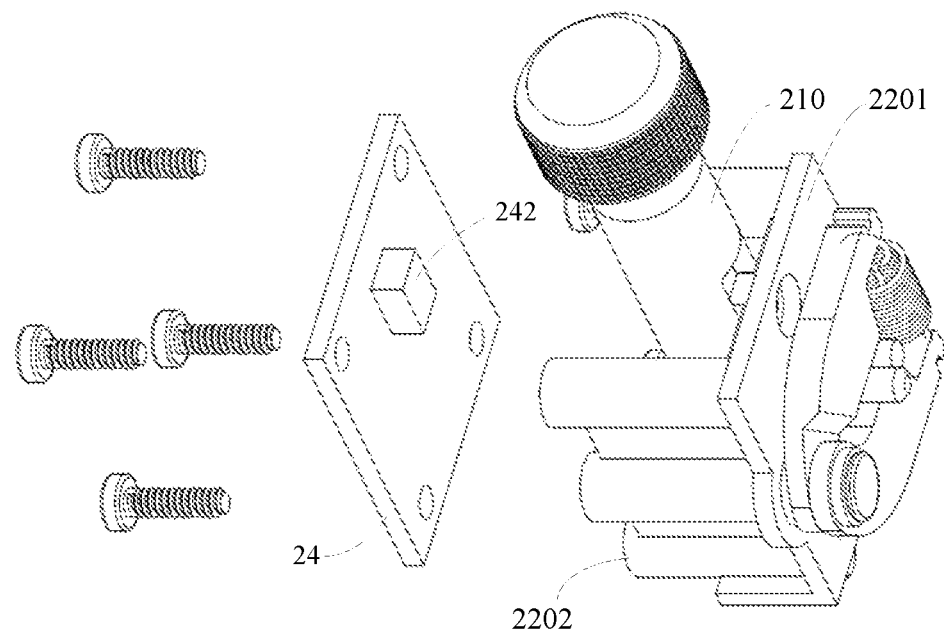
FIG. 14 is a schematic assembly diagram of the operating rod assembly of the joystick mechanism shown in FIG. 6, a first reset assembly and a first circuit board.
Figure 15:
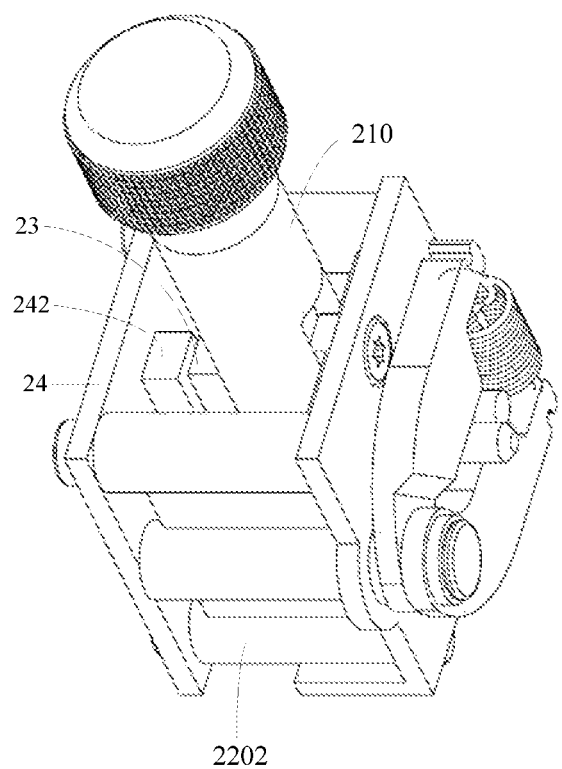
FIG. 15 is a three dimensional view of the operating rod assembly, the first reset assembly and the first circuit board shown in FIG. 14.
Figure 16:
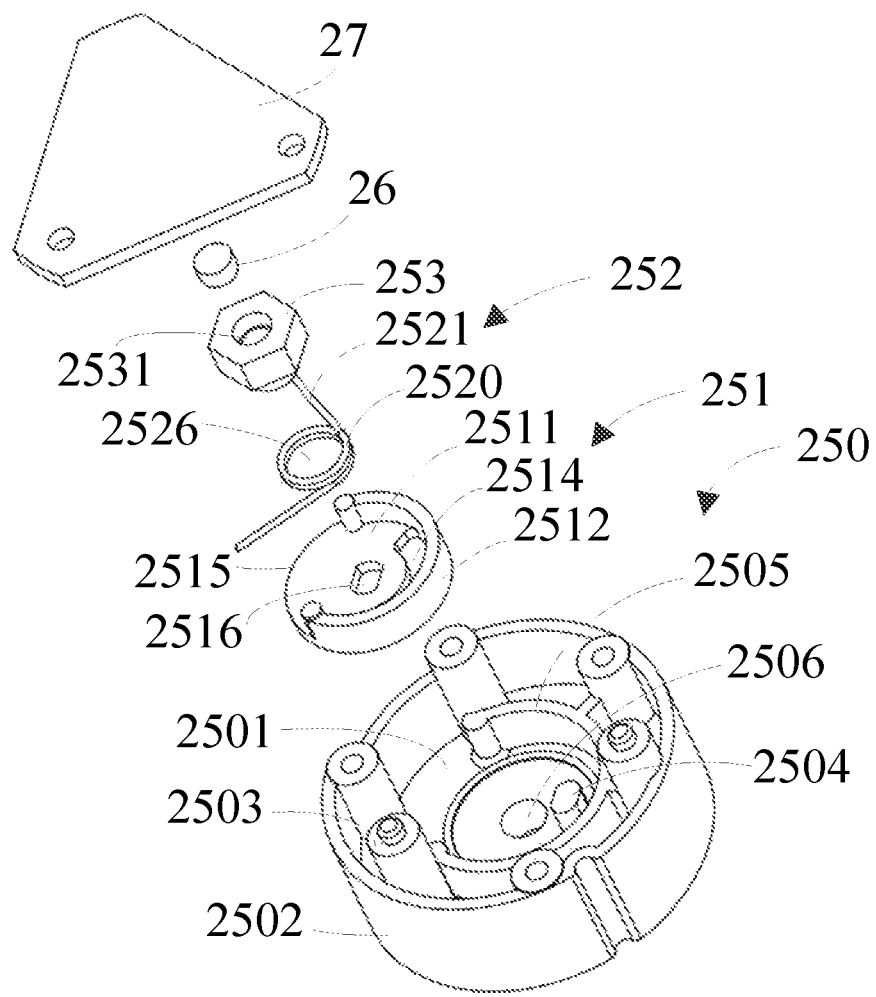
FIG. 16 is an exploded view of a second reset assembly and a second circuit board of the joystick mechanism shown in FIG. 6.
Figure 17:
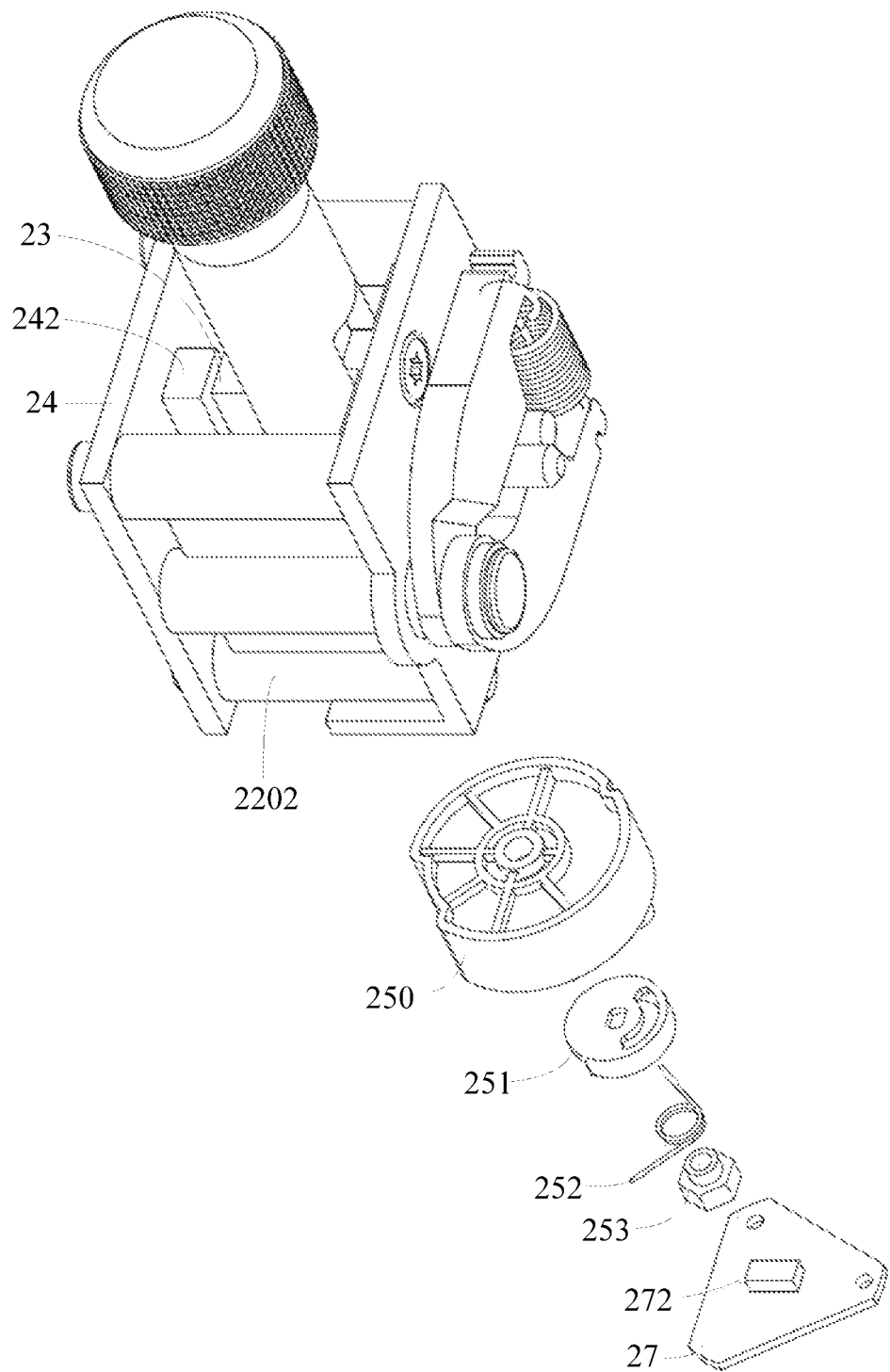
FIG. 17 is a schematic assembly diagram of an operating rod assembly, a first reset assembly, a first circuit board, a second reset assembly and a second circuit board according to an embodiment of the present application.
Figure 18:
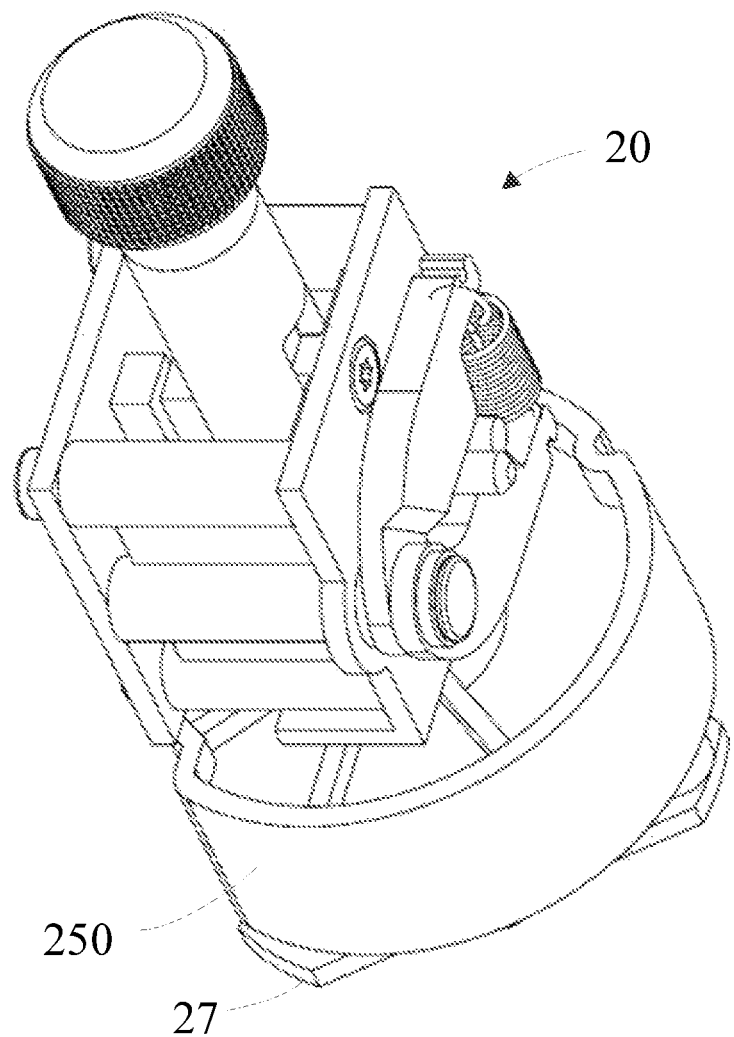
FIG. 18 is a three dimensional view of an operating rod assembly, a first reset assembly, a first circuit board, a second reset assembly and a second circuit board according to an embodiment of the present application.
Figure 19:
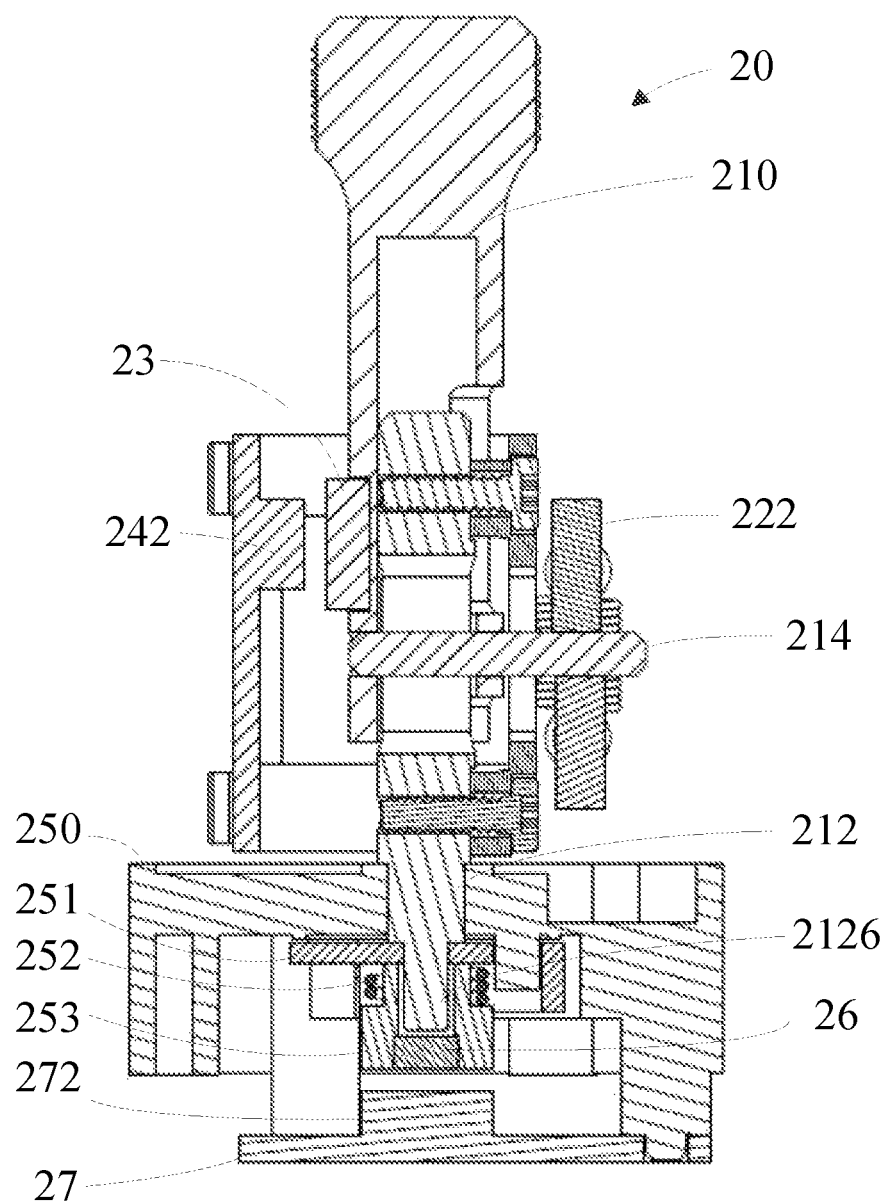
FIG. 19 is a sectional view of the operating rod assembly, the first reset assembly, the first circuit board, the second reset assembly and the second circuit board shown in FIG. 18.

Referring to FIG. 14 and FIG. 15, the first magnetic component 23 is mounted to the first rod body 210. The first circuit board 24 is fixedly mounted to the two supporting blocks 2202, so that the first magnetic sensor 242 faces the first magnetic component 23.

Referring to FIG. 16 to FIG. 19, the rotating member 251 is placed in the space limited by the arc-shaped inner side wall 2505. The second limiting post 2504 passes through the second guide groove 2514. The first shaft through hole 2506 is aligned with the second shaft through hole 2516. The torsion spring body 2520 is placed in the space limited by the arc-shaped outer side wall 2512. The third shaft through hole 2526 is aligned with the second shaft through hole 2516. The two torsion spring mounting arms 2521 are exposed from the notch 2515 and separately abut the two ends of the arc-shaped outer side wall 2512. The second magnetic component 26 is fixed to the accommodating hole 2531 of the fixing member 253. The fixing member 253 is partially accommodated in the third shaft through hole 2526. The connection end 2126 of the second rod body 212 passes through the first shaft through hole 2506 and the second shaft through hole 2516 sequentially and is finally fixedly connected to the fixing member 253. The second circuit board 27 is fixedly mounted to the two mounting posts 2503 of the connecting bracket 250. In this way, the joystick mechanism 20 is obtained through the assembly.

Figure 20:
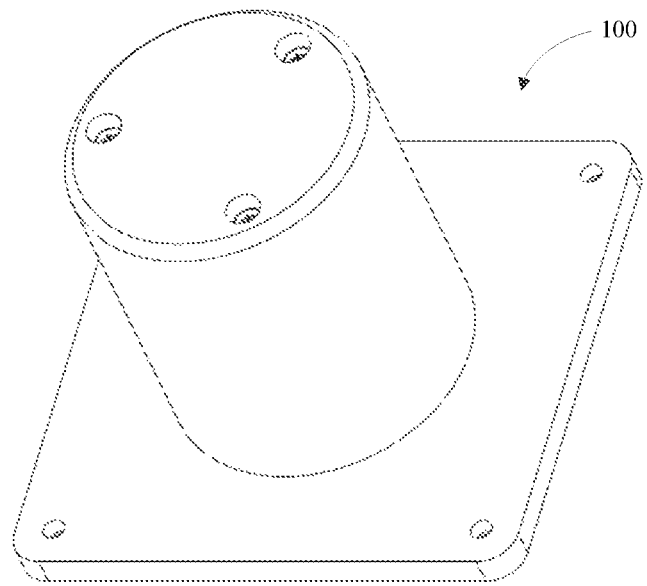
FIG. 20 is a three dimensional view of a joystick device according to an embodiment of the present application from another perspective.

Referring to FIG. 20, the joystick mechanism 20 is placed in the cavity 120. After passing through a bottom portion of the bottom housing 12, bolts are inserted into and fixed to three mounting posts 2503 of the connecting bracket 250. The second circuit board 27 abuts the bottom portion of the bottom housing 12. The upper housing 11 covers the opening of the cavity 120. The engagement block 112 is correspondingly inserted into the slot 122. The groove 114 correspondingly accommodates the protrusion 124. In this way, the joystick device 100 (for which, reference may also be made to FIG. 4) of this embodiment of the present application is obtained through the assembly.

Figure 21:
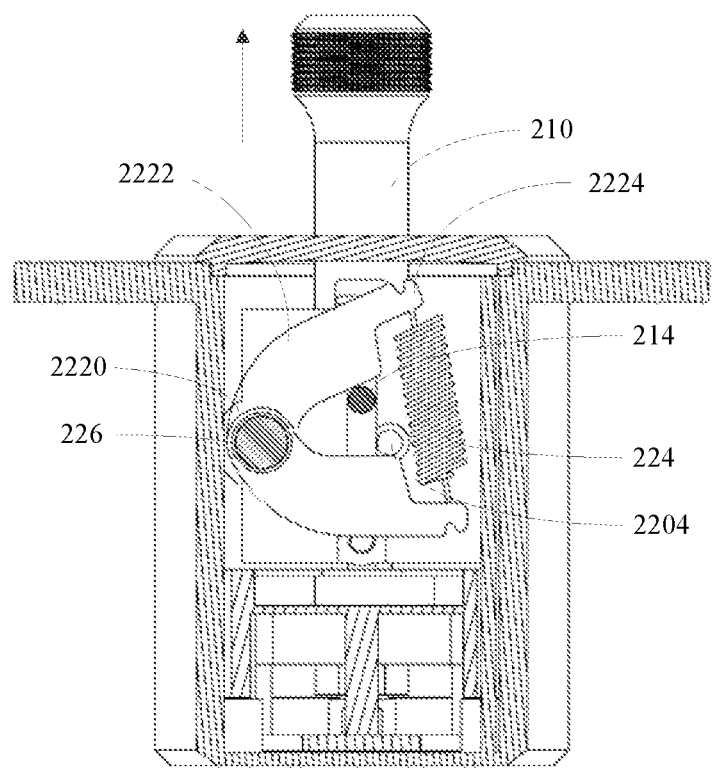
FIG. 21 is a sectional view of a joystick device according to an embodiment of the present application, where the operating rod assembly moves along a first direction.

Referring to FIG. 21, an upward pulling force is applied to the first rod body 210, so that when the pin shaft 214 linearly moves along the first direction (for example, an upward direction in FIG. 21) from an initial position together with the first rod body 210, the first limiting post 2204 abuts one of the abutment portions 2222, the pin shaft 214 drives the other abutment portion 2222 to open along the first direction, and the elastic component 224 is stretched. The first magnetic component 23 is driven by the first rod body 210 to linearly move along the first direction from an initial position. The first magnetic sensor 242 senses a magnetic field change of the first magnetic component 23, to obtain a movement position of the first magnetic component 23 along the first direction. The first circuit board 24 generates a control instruction according to the movement position of the first magnetic component 23 that is obtained by the first magnetic sensor 242. The remote control 200 sends the control instruction to the controlled mobile device, so that the mobile device linearly moves along the first direction.

Figure 22:
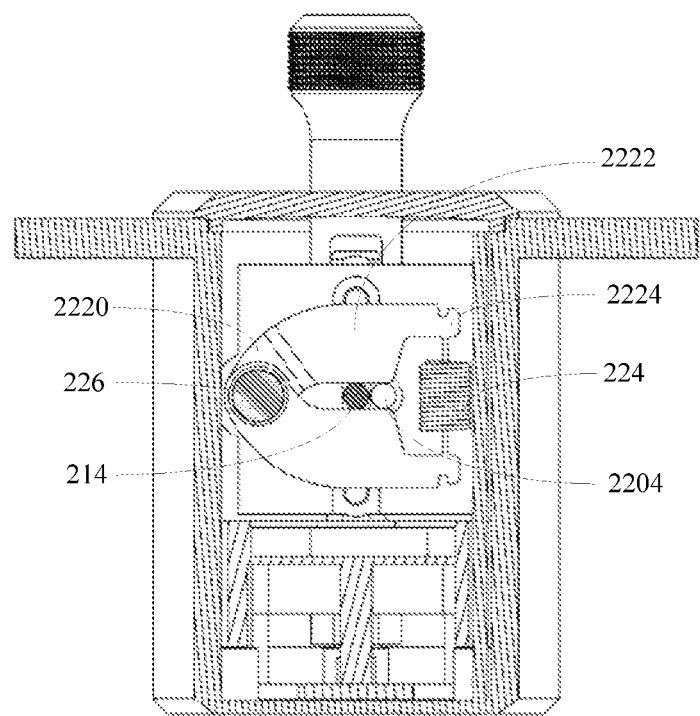
FIG. 22 is a sectional view of a joystick device according to an embodiment of the present application, where the operating rod assembly is reset to an initial position.

Referring to FIG. 22, when the pulling force applied to the first rod body 210 disappears, the stretched elastic component 224 restores to an original state, to pull the opening swing block 222 to reset, thereby driving the pin shaft 214, the first rod body 210 and the first magnetic component 23 to reset, so that the first magnetic component 23 moves to the initial position along the second direction.

Figure 23:
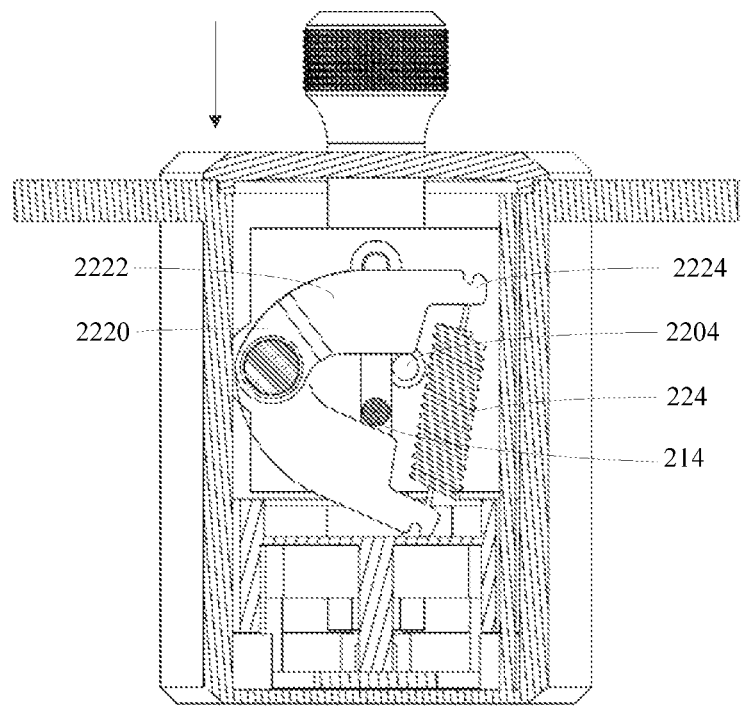
FIG. 23 is a sectional view of a joystick device according to an embodiment of the present application, where the operating rod assembly moves along a second direction.

Referring to FIG. 23, a downward thrust is applied to the first rod body 210, so that when the pin shaft 214 linearly moves along the second direction (for example, a downward direction in FIG. 23) from an initial position together with the first rod body 210, the first limiting post 2204 abuts one of the abutment portions 2222, the pin shaft 214 drives the other abutment portion 2222 to open along the second direction, and the elastic component 224 is stretched. The first magnetic component 23 is driven by the first rod body 210 to linearly move along the second direction from an initial position. The first magnetic sensor 242 senses a magnetic field change of the first magnetic component 23, to obtain a movement position of the first magnetic component 23 along the second direction. The first circuit board 24 generates a control instruction according to the movement position of the first magnetic component 23 that is obtained by the first magnetic sensor 242. The remote control 200 sends the control instruction to the controlled mobile device, so that the mobile device linearly moves along the second direction.

When the thrust applied to the first rod body 210 disappears, the stretched elastic component 224 restores to an original state, to pull the opening swing block 222 to reset, thereby driving the pin shaft 214, the first rod body 210 and the first magnetic component 23 to reset, so that the first magnetic component 23 moves to the initial position along the first direction.

Figure 24:
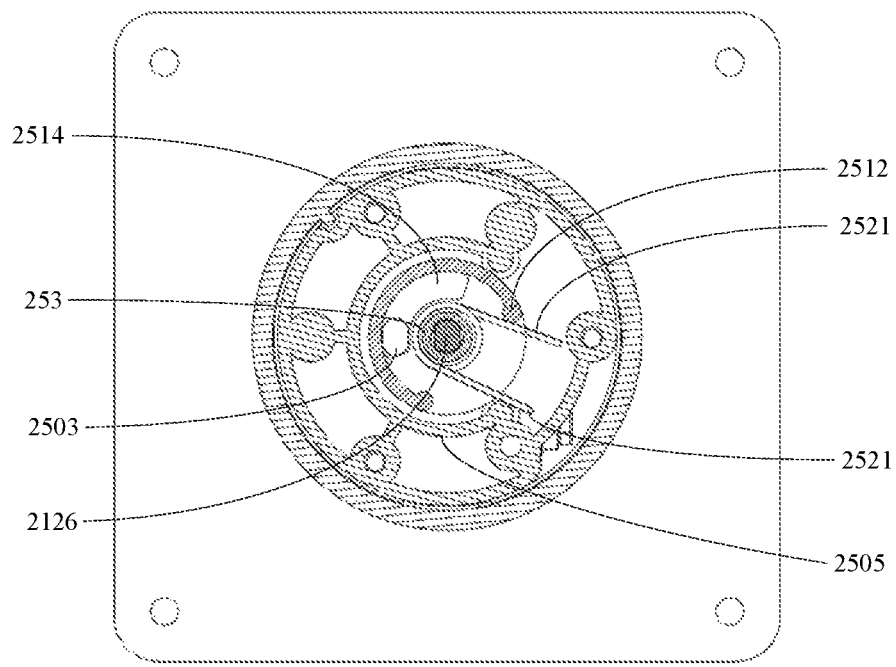
FIG. 24 is a sectional view of a joystick device according to an embodiment of the present application, where the operating rod assembly rotates along a third rotation direction or a fourth rotation direction.
Figure 25:
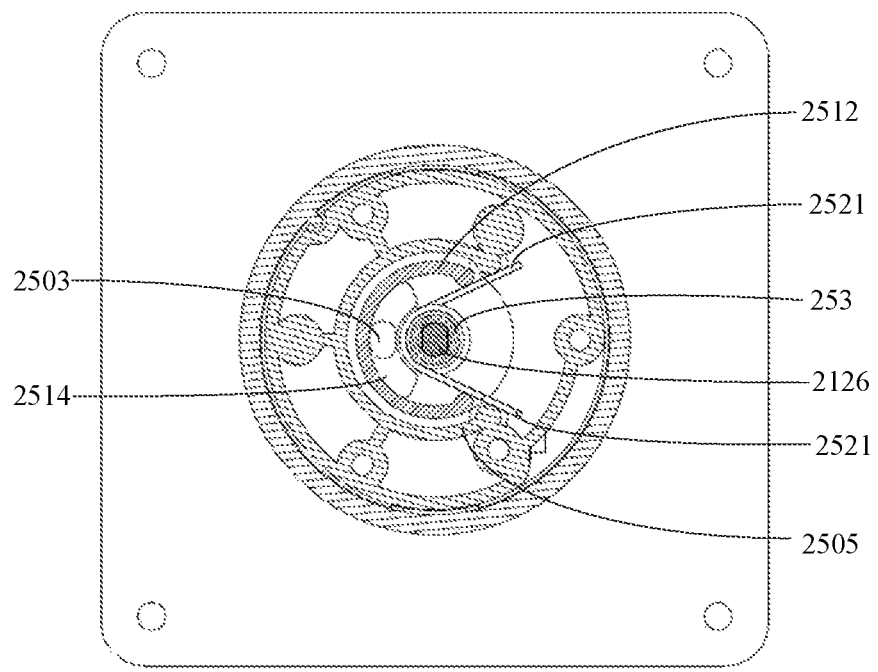
FIG. 25 is a sectional view of a joystick device according to an embodiment of the present application, where the operating rod assembly is reset to an initial position along a third rotation direction or a fourth rotation direction.

Referring to FIG. 24 and FIG. 25, a twisting force is applied to the first rod body 210, so that the first rod body 210 drives the second rod body 212, the first reset assembly 22 and the first circuit board 24 to rotate along the third rotation direction or the fourth rotation direction. The connection end 2126 drives the rotating member 251 and the fixing member 253 to rotate relative to the connecting bracket 250 and the second circuit board 27 along the third rotation direction or the fourth rotation direction.

When the fixing member 253 rotates relative to the second circuit board 27 along the third rotation direction or the fourth rotation direction, the second magnetic component 26 rotates relative to the second magnetic sensor 272 along the third rotation direction or the fourth rotation direction from an initial position. The second magnetic sensor 272 senses a magnetic field change of the second magnetic component 26, to obtain a rotation amount of the second magnetic component 26 along the third rotation direction or the fourth rotation direction. The second circuit board 27 generates a control instruction according to the rotation amount of the second magnetic component 26 that is obtained by the second magnetic sensor 272. The remote control 200 sends the control instruction to the controlled mobile device, so that the mobile device rotates along the third rotation direction or the fourth rotation direction.

When the rotating member 251 rotates relative to the connecting bracket 250, one of the torsion spring mounting arms 2521 is pushed by one end of the arc-shaped outer side wall 2512 to move along the third rotation direction or the fourth rotation direction toward one end of the other torsion spring mounting arm 2521 and the arc-shaped inner side wall 2505, and one end of the arc-shaped outer side wall 2512 and one end of the arc-shaped inner side wall 2505 respectively press the two torsion spring mounting arms 2521, so that the torsion spring 252 is compressed.

When the twisting force applied to the first rod body 210 disappears, the torsion spring 252 restores to an original shape. The two torsion spring mounting arms 2521 separately pushes one end of the arc-shaped outer side wall 2512 and one end of the arc-shaped inner side wall 2505. The rotating member 251 rotates relative to the connecting bracket 250 along the fourth rotation direction or the third rotation direction, to drive the fixing member 253, the first rod body 210, the second rod body 212, the first reset assembly 22 and the first circuit board 24 to reset along the fourth rotation direction or the third rotation direction, so that the second magnetic component 26 rotates to the initial position along the fourth rotation direction or the third rotation direction.

Figure 26:
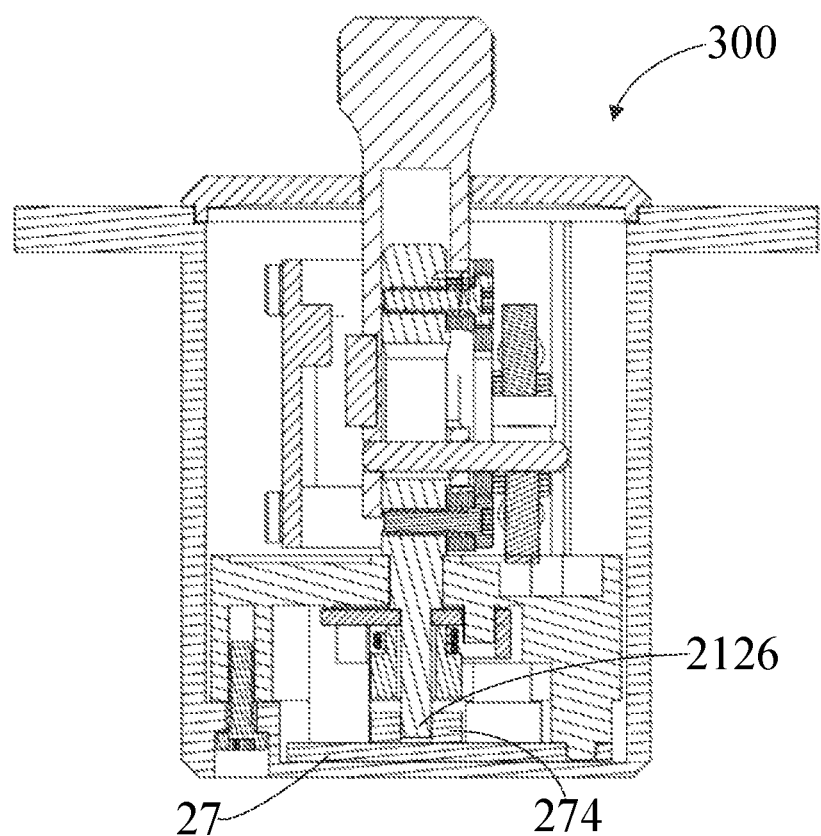
FIG. 26 is a sectional view of a joystick device according to another embodiment of the present application.

Referring to FIG. 26, a structure of a joystick device 300 provided in another embodiment of the present application is basically the same as that of the joystick device 100 provided in the foregoing embodiment. A difference lies in that the joystick device 300 adopts a potentiometer 274 instead of the magnetic sensor 272 of the joystick device 100.

The potentiometer 274 is disposed on the circuit board 27. The connection end 2126 is inserted into the potentiometer 274 and in contact with the potentiometer 274.

When the connection end 2126 rotates relative to the potentiometer 274 and the second circuit board 27 along the third rotation direction or the fourth rotation direction, the potentiometer 274 obtains, according to a change in a resistor value or a voltage, a rotation amount of the connection end 2126 along the third rotation direction or the fourth rotation direction. A processor disposed on the circuit board 27 generates a corresponding control instruction. The remote control 200 sends the control instruction to the controlled mobile device, so that the mobile device rotates along the third rotation direction or the fourth rotation direction.

In the joystick devices 100 and 300 in the embodiments of the present invention, the first rod body 210 has movements in only four directions: linearly moving along the first direction and the second direction and rotating along the third rotation direction and the fourth rotation direction. The operations are simple and are easy to remember by a user. Moreover, when the force applied to the first rod body 210 disappears, the first reset assembly 22 or the second reset assembly 25 is capable of making the first rod body 210 reset, thereby further simplifying operations of the joystick device 100.

In some embodiments, the mobile device is a UAV. The remote control 200 is configured to control the UAV. When the first rod body 210 linearly moves along the first direction (for example, the upward direction in FIG. 21), the remote control 200 controls the UAV to ascend. When the first rod body 210 linearly moves along the second direction (for example, the downward direction in FIG. 23), the remote control 200 controls the UAV to descend. When the first rod body 210 rotates along the third rotation direction or the fourth rotation direction, the remote control 200 controls the UAV to rotate leftward or rotate rightward. A moving direction of the first rod body 210 corresponds to a moving direction of the UAV, so that operations of the remote control 200 are intuitive and simple. In addition, the first rod body 210 has movements in only four directions, which is easy to remember by a user. Moreover, when the force applied to the first rod body 210 disappears, the first reset assembly 22 or the second reset assembly 25 is capable of making the first rod body 210 reset, thereby further simplifying operations of the remote control 200.

Finally, it should be noted that the foregoing embodiments are used only for describing the technical solutions of the present application, but not for limiting the technical solutions. According to the idea of the present application, technical features in the foregoing embodiments or different embodiments may be combined, steps may be performed in any sequence and there are many other variations of different aspects of the present application described above. For brevity, they are not provided in detail. Although the present application is described in detail with reference to the foregoing embodiments, a person of ordinary skill in the art should understand that, the technical solutions recorded in the foregoing embodiments may also be modified, or equivalently replacement may be performed on some technical features thereof. The modifications or replacement shall not make the essence of the corresponding technical solutions depart from the scope of the technical solutions of the embodiments of the present application.

What is claimed is:

1. A joystick device, comprising:
    an operating rod assembly;
    a first magnetic component, the first magnetic component being mounted to the operating rod assembly;
    a first circuit board, comprising a first magnetic sensor, the first magnetic sensor facing the first magnetic component, the first magnetic component being capable of moving from an initial position relative to the first magnetic sensor along a first direction or a second direction when driven by the operating rod assembly, and the first direction being opposite to the second direction; and
    a first reset assembly, the first reset assembly being connected to the operating rod assembly, and the first reset assembly being configured to reset the operating rod assembly along the second direction or the first direction, so that the first magnetic component is reset to the initial position;
    wherein the first magnetic component is capable of linearly moving from the initial position relative to the first magnetic sensor along the first direction or the second direction when driven by the operating rod assembly; and the joystick device comprises:
    a second magnetic component, the second magnetic component being mounted to the operating rod assembly;
    a second circuit board, comprising a second magnetic sensor, the second magnetic sensor facing the second magnetic component, and the second magnetic component being capable of rotating from an initial position relative to the second magnetic sensor along a third rotation direction or a fourth rotation direction when driven by the operating rod assembly; and
    a second reset assembly, the second reset assembly being connected to the operating rod assembly, and the second reset assembly being configured to reset the operating rod assembly along the fourth rotation direction or the third rotation direction, so that the second magnetic component is reset to the initial position.

2. The joystick device according to claim 1, wherein the operating rod assembly comprises a first rod body, a second rod body and a pin shaft;
    wherein central shafts of the first rod body and the second rod body are disposed along the first direction and the second direction;
    wherein the first rod body is provided with an accommodating passage and a pin hole, the accommodating passage being provided along an axial direction of the first rod body, and the pin hole being provided in an outer side wall of the first rod body;
    wherein an outer side wall of the second rod body is provided with a sliding groove, the sliding groove being provided along an axial direction of the second rod body, and the second rod body being partially accommodated in the accommodating passage and being capable of moving relative to the first rod body along the axial direction of the second rod body; and
    wherein one end of the pin shaft passes through the pin hole and is accommodated in the sliding groove.

3. The joystick device according to claim 2, wherein the second rod body is connected to the first reset assembly and the second reset assembly;
    wherein the first magnetic component is mounted to the first rod body, the first rod body, the pin shaft and the first magnetic component being capable of linearly moving relative to the second rod body together along the first direction or the second direction; and
    wherein the first reset assembly is configured to drive the pin shaft to reset along the first direction or the second direction, so that the first magnetic component is reset to the initial position.

4. The joystick device according to claim 3, wherein the first reset assembly comprises a mounting bracket, a swing block and an elastic component; wherein
    the mounting bracket comprises a first limiting post and is provided with a first guide groove;
    the number of the swing blocks is two, one end of each swing block and one end of the other swing block being both hingedly connected to the mounting bracket;
    two ends of the elastic component are separately connected to the other end of each swing block;
    the second rod body is fixedly mounted to the mounting bracket; and
    the pin shaft passes through the first guide groove and is capable of moving along the first direction or the second direction within the first guide groove, the pin shaft and the first limiting post being located between the two swing blocks.

5. The joystick device according to claim 4, wherein each swing block comprises a hinged end, an abutment portion and a free end, the abutment portion being located between the hinged end and the free end; wherein
    two hinged ends of the two swing blocks are both hingedly connected to the mounting bracket;
    the two ends of the elastic component are separately connected to the two free ends of the two swing blocks; and
    the pin shaft and the first limiting post are disposed in parallel between the two abutment portions of the two swing blocks.

6. The joystick device according to claim 4, wherein the first circuit board is fixedly mounted to the mounting bracket; wherein
    the mounting bracket is provided with a rod passage, the first rod body and the second rod body being partially accommodated in the rod passage; and
    the second rod body is connected to the second reset assembly and the second magnetic component, the second magnetic component being capable of rotating from the initial position relative to the second magnetic sensor along the third rotation direction or the fourth rotation direction when driven by the second rod body; the second reset assembly being configured to reset the second rod body along the fourth rotation direction or the third rotation direction, so that the second magnetic component is reset to the initial position.

7. The joystick device according to claim 6, wherein the second reset assembly comprises a connecting bracket, a rotating member and a torsion spring; wherein
    the connecting bracket comprises a bottom portion, a second limiting post and an arc-shaped inner side wall, the arc-shaped inner side wall being connected to the bottom portion, and one end of the second limiting post being connected to the bottom portion;
    the rotating member comprises a bottom plate and an arc-shaped outer side wall, the arc-shaped outer side wall being connected to the bottom plate; the bottom plate being provided with an arc-shaped second guide groove, and a notch being provided between two ends of the arc-shaped outer side wall;
    the second limiting post passes through the second guide groove;
    the torsion spring is partially accommodated in a space limited by the arc-shaped outer side wall, the torsion spring comprising two torsion spring mounting arms, and the two torsion spring mounting arms passing through the notch and separately abutting the two ends of the arc-shaped outer side wall; and
    the second rod body passes through the connecting bracket and the rotating member, the second rod body being capable of driving the rotating member to rotate relative to the connecting bracket along the third rotation direction or the fourth rotation direction.

8. The joystick device according to claim 7, wherein the second rod body comprises a connection end, the connection end being fixedly connected to the second magnetic component.

9. The joystick device according to claim 8, wherein the second reset assembly comprises a fixing member, the second magnetic component being mounted to the fixing member, and the connection end being fixedly connected to the fixing member.

10. The joystick device according to claim 7, wherein the second circuit board is fixedly mounted to the connecting bracket.

11. The joystick device according to claim 1, wherein the first magnetic sensor and the second magnetic sensor are both Hall elements.

12. The joystick device according to claim 1, wherein the joystick device comprises a housing, the housing comprising an upper housing and a bottom housing, the upper housing being mounted to the bottom housing, and the bottom housing having a cavity; and wherein
    the operating rod assembly passes through the housing, the operating rod assembly being partially accommodated in the cavity, and the first reset assembly, the first magnetic component and the first circuit board all being accommodated in the cavity.

13. The joystick device according to claim 12, wherein the second circuit board is fixedly mounted to the bottom housing.

14. The joystick device according to claim 12, wherein two engagement blocks separately extend from two opposite sides of the upper housing, an outer side of each engagement block being provided with a groove, and the two grooves of the two engagement blocks being disposed in opposite directions;
    an inner wall of the cavity is provided with two oppositely disposed slots, an inner wall of each slot being provided with a protrusion; and
    the upper housing covers an opening of the cavity, the engagement block being correspondingly inserted into the slot, and the groove correspondingly accommodating the protrusion.

15. A remote control, comprising a housing and the joystick device according to claim 1, the joystick device being mounted in the housing.

16. A joystick device, comprising:
    an operating rod assembly;
    a first magnetic component, the first magnetic component being mounted to the operating rod assembly;
    a first circuit board, comprising a first magnetic sensor, the first magnetic sensor facing the first magnetic component, the first magnetic component being capable of moving from an initial position relative to the first magnetic sensor along a first direction or a second direction when driven by the operating rod assembly, and the first direction being opposite to the second direction; and
    a first reset assembly, the first reset assembly being connected to the operating rod assembly, and the first reset assembly being configured to reset the operating rod assembly along the second direction or the first direction, so that the first magnetic component is reset to the initial position;
    wherein the first magnetic component is capable of linearly moving from the initial position relative to the first magnetic sensor along the first direction or the second direction when driven by the operating rod assembly; and wherein
    the joystick device comprises:
    a second circuit board, provided with a potentiometer, the operating rod assembly being inserted into the potentiometer and in contact with the potentiometer, and the operating rod assembly being capable of rotating from an initial position relative to the potentiometer along a third rotation direction or a fourth rotation direction; and
    a second reset assembly, the second reset assembly being connected to the operating rod assembly, and the second reset assembly being configured to reset the operating rod assembly to the initial position along the fourth rotation direction or the third rotation direction.

17. The joystick device according to claim 16, wherein the joystick device comprises a housing, the housing comprising an upper housing and a bottom housing, the upper housing being mounted to the bottom housing, and the bottom housing having a cavity; and wherein the operating rod assembly passes through the housing, the operating rod assembly being partially accommodated in the cavity, and the first reset assembly, the first magnetic component and the first circuit board all being accommodated in the cavity.

18. The joystick device according to claim 17, wherein the second circuit board is fixedly mounted to the bottom housing.

19. The joystick device according to claim 17, wherein two engagement blocks separately extend from two opposite sides of the upper housing, an outer side of each engagement block being provided with a groove, and the two grooves of the two engagement blocks being disposed in opposite directions;

an inner wall of the cavity is provided with two oppositely disposed slots, an inner wall of each slot being provided with a protrusion; and the upper housing covers an opening of the cavity, the engagement block being correspondingly inserted into the slot, and the groove correspondingly accommodating the protrusion.

\* \* \* \* \*